United States Patent [19]

Proebsting et al.

[11] 3,969,706
[45] July 13, 1976

[54] DYNAMIC RANDOM ACCESS MEMORY MISFET INTEGRATED CIRCUIT

[75] Inventors: Robert James Proebsting; Robert Sherman Green, both of Richardson, Tex.

[73] Assignee: Mostek Corporation, Carrollton, Tex.

[22] Filed: Oct. 8, 1974

[21] Appl. No.: 513,091

[52] U.S. Cl. .......................... 340/173 R; 340/172.5
[51] Int. Cl.² ...................... G11C 7/00; G11C 7/06; G11C 9/00
[58] Field of Search .................... 340/173 R, 172.5; 307/238

[56] References Cited
UNITED STATES PATENTS

| | | | |
|---|---|---|---|
| 3,771,145 | 11/1973 | Wiener | 340/173 R |
| 3,801,964 | 4/1974 | Palfi et al. | 340/173 R |
| 3,806,880 | 4/1974 | Spence | 340/172.5 |

Primary Examiner—Stuart N. Hecker
Attorney, Agent, or Firm—Hubbard, Thurman, Turner & Tucker

[57] ABSTRACT

A MISFET dynamic random access memory chip having 4,096 single transistor, single capacitor storage cells yet packaged in a standard sixteen pin dual inline package is disclosed. Six bit row address and six bit column address data are sequentially multiplexed into row address latches and column address latches through six address pins by sequentially occurring row address and column address strobes. Sixty-four bits of information from an address row are read and transferred to a sixty-four bit column register. One bit of the column register is then selected by the column address decoder so that data is transferred from that bit to a data output latch. Data is transferred into a data input latch and then to the addressed bit of the storage matrix as well as to the addressed column register by a write signal. Upon completion of the row address strobe cycle, each cell in the address row is automatically refreshed by the data in the respective bit of the column register, including the bit which may have been modified by a write cycle. The state of the data output latch remains valid until a subsequent column address strobe is received. The write signal to the chip provides for a read only or a write only cycle, in addition to the read-modify-write cycle. In the absence of a chip select, the data output assumes an open circuit condition. The sense amp utilizes a dynamic differential amplifier to sense a voltage change of a precharged column bus. The entire system is substantially entirely dynamic in operation and accordingly has very low power consumption.

30 Claims, 14 Drawing Figures

DYNAMIC RANDOM ACCESS MEMORY MISFET INTEGRATED CIRCUIT

The present invention relates generally to large scale integrated semiconductor circuits, and more particularly relates to an integrated circuit having a large number of binary storage cells which may be randomly addressed for the purpose of reading data from, or writing data into the address storage cell.

It is generally known that random access memories can be formed from a large number of integrated semiconductor circuit chips each having a large number of binary data storage cells. The largest circuits in wide spread commercial use have heretofore had only 1,024 storage cells, each comprised of a storage capacitor and three or more metal-oxide-semiconductor field effect transistors (MOSFET) for storing and reading the voltage on the storage capacitor. It has been proposed to utilize dynamic storage cells in which only one transistor per storage cell is used so that a larger number of such cells can be placed on a single integrated circuit chip of practical size. The use of this type of storage cell, however, makes the task of determining whether a logic "1" or a logic "0" is stored in the cell very difficult because of the relatively small change in voltage level resulting when the cell is addressed. Another difficult problem resulting from an increase in the number of cells is that a larger number of address inputs is required to uniquely define a particular storage cell. The time required to retrieve a particular bit of data from a random access memory, commonly referred to as access time, is always a critical factor in such a system. Since a large number of random access memory chips are typically used in a total system with high packing densities, a high premium is placed on low power consumption.

The present invention is concerned with an improved random access memory in which 4,096 storage cells are arranged in sixty-four rows and sixty-four columns. The chip has six address lines which go to the inputs of a six bit row address latch and also to the inputs of a six bit column address latch. Data applied to the six input lines indicating the row of a particular storage cell is strobed into the row address latches by a row address strobe signal. The row address strobe also initiates an automatic cycle which then detects the logic level stored in each cell of the addressed row and transfers the logic level to a corresponding bit of a sixty-four bit storage register and also restores the cell to its initial state. Address data is then applied to the six address inputs indicative of the column of the particular storage cell, and a column address strobe initiates a sequence which latches the address data in the column address latch. If the chip is selected by a signal on a chip select input line, the column address is decoded and the data in the addressed bit of the sixty-four bit register which contains the data of the address cell is then transferred to a data output latch. A write signal to the chip strobes new data into a data input latch and automatically transfers the new data into the addressed bit of the column register as well as into the addressed cell of the storage matrix. On completion of the row address strobe, the sixty-four storage cells in the addressed row have been automatically refreshed with the data previously read from the cells except as the addressed bit of the column register might have been modified. Data on the output latch is valid between successive read cycles. The write signal aborts the read cycle if it occurs prior to the time data is to be transferred to the data output latch, in which case the data output goes to a logic "1". In accordance with another important aspect of the invention, the access time can be substantially reduced when successively addressing storage cells in the same row because once a row is addressed and data transferred to the column register, read, write or read-modify-write cycles can be performed sequentially on any number of bits in the column register merely by changing the address inputs for each of a series of column address strobes. Since the general organization of the random access memory requires only six address pins and a total of only twelve data pins, the chip may be packaged in a standard sixteen pin dual-inline IC package. Various aspects of the organization of the random access memory as well as an improved sense amplifier circuit and other specific circuits are hereafter pointed out with particularity in the claims.

A more complete understanding of the invention may be had by referring to the following detailed description of a preferred embodiment when taken in conjunction with the drawings, wherein.

The following specification is divided into two major parts. The first part describes the circuit components in detail without attempting to explain the operation. The second part explains the operation while assuming that the reader is familiar with the first part.

Figure 1:
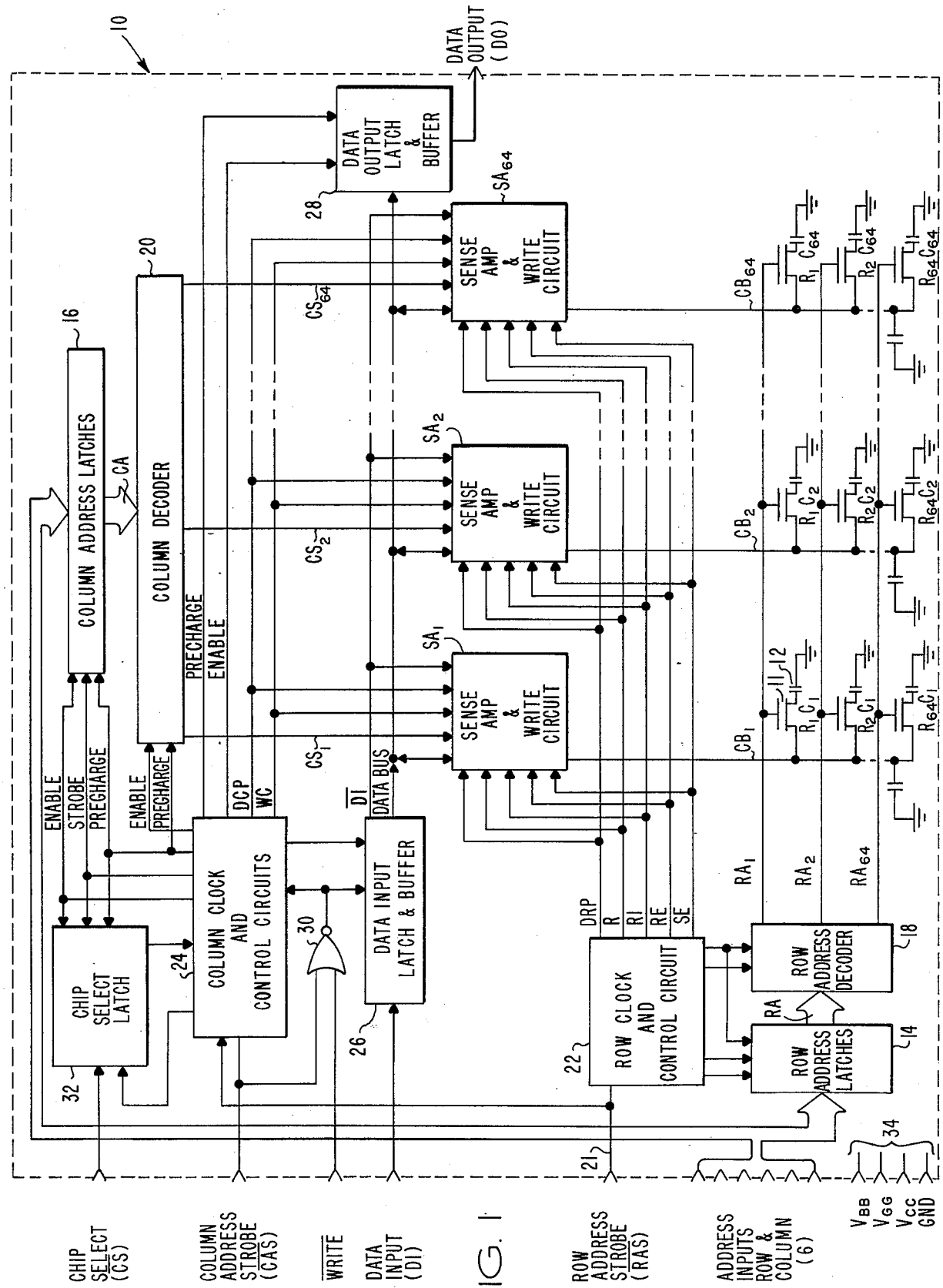
FIG. 1 is a schematic block diagram of a dynamic random access memory in accordance with the present invention.

Referring now to the drawings, a dynamic random access memory in accordance with the present invention is indicated generally by the reference numeral 10 in FIG. 1. The dynamic random access memory 10 is fabricated as a single integrated circuit using MISFET (metal-insulator-semiconductor field effect transistor) technology. The memory 10 is an N-channel system, although a P-channel system could be used if desired. Accordingly as used herein, "high" refers to $V_{gg}$, whether positive for N-channel systems or negative for P-channel systems, and low refers to ground potential.

The integrated circuit 10 preferably has a total of 4,096 binary storage cells arrayed in a 64 × 64 matrix with rows $R_1 - R_{64}$ and columns $C_1 - C_{64}$. Each storage cell, for example cell $R_1C_1$, is comprised of a field effect transistor 11 and a capacitor 12. The gate of transistor 11, and the gates of the transistors of all other storage cells in the first row are connected to a row address line $RA_1$. Row address lines $RA_2 - RA_{64}$ are similarly connected to the gates of all the transistors of the cells in rows 2 – 64, respectively. Transistor 11 and capacitor 12 are connected between column bus $CB_1$ and a fixed potential which may be $V_{gg}$ or in this case ground, as are the transistors and capacitors of all other storage cells in the first column. The transistors and capacitors of the cells in columns 2 – 64 are similarly connected to column buses $CB_2 - CB_{64}$, respectively.

It will be appreciated that twelve binary bits are required to individually address 4,096 storage cells. However, only six common address inputs are continuously applied to a six bit row address latch 14 and to a six bit column address latch 16. As will hereafter be described, six bit row and six bit column address information is multiplexed into the row and column address latches. A row address decoder 18 selects one of the row address lines $RA_1 - RA_{64}$ in response to the six bits of data stored in the row address latch. The sixty-four column buses $CB_1 - CB_{64}$ are connected to sixty-four sense amp and write circuits $SA_1 - SA_{64}$, respectively, which form a sixty-four bit register as will hereafter be described. One of the sixty-four sense amps is selected by the column decoder 20 in response to a particular six bit address code stored in the column address latch 16.

The row address latch 14, the row address decoder 18 and the row read and refresh cycles of sense amps $SA_1 - SA_{64}$ are automatically operated in a predetermined manner, which will presently be described, by a row clock and control circuit 22 in response to a row address strobe. The column address latch 16, the column decoder 20, the column read and write cycles of sense amp and write circuits $SA_1 - SA_{64}$, and the data output latch and buffer 28 are automatically operated by a column clock and control circuit 24 in response to a column address strobe.

Data is input to a data input latch and buffer 26 which is controlled by the column clock and control circuit 24 and the $\overline{WRITE}$ input as will presently be described. A write command signal is applied together with the column address strobe to a NOR gate 30, and a chip select signal is applied to a chip select input latch 32. Four voltage inputs $V_{bb}$, $V_{gg}$, $V_{cc}$, and GND are required to operate the circuit, and are indicated collectively by the reference numeral 34. Thus, it is important to note that only a total of sixteen external connections are required to operate the integrated circuit 10 which can thus be placed in a standard sixteen pin package.

Figure 2:
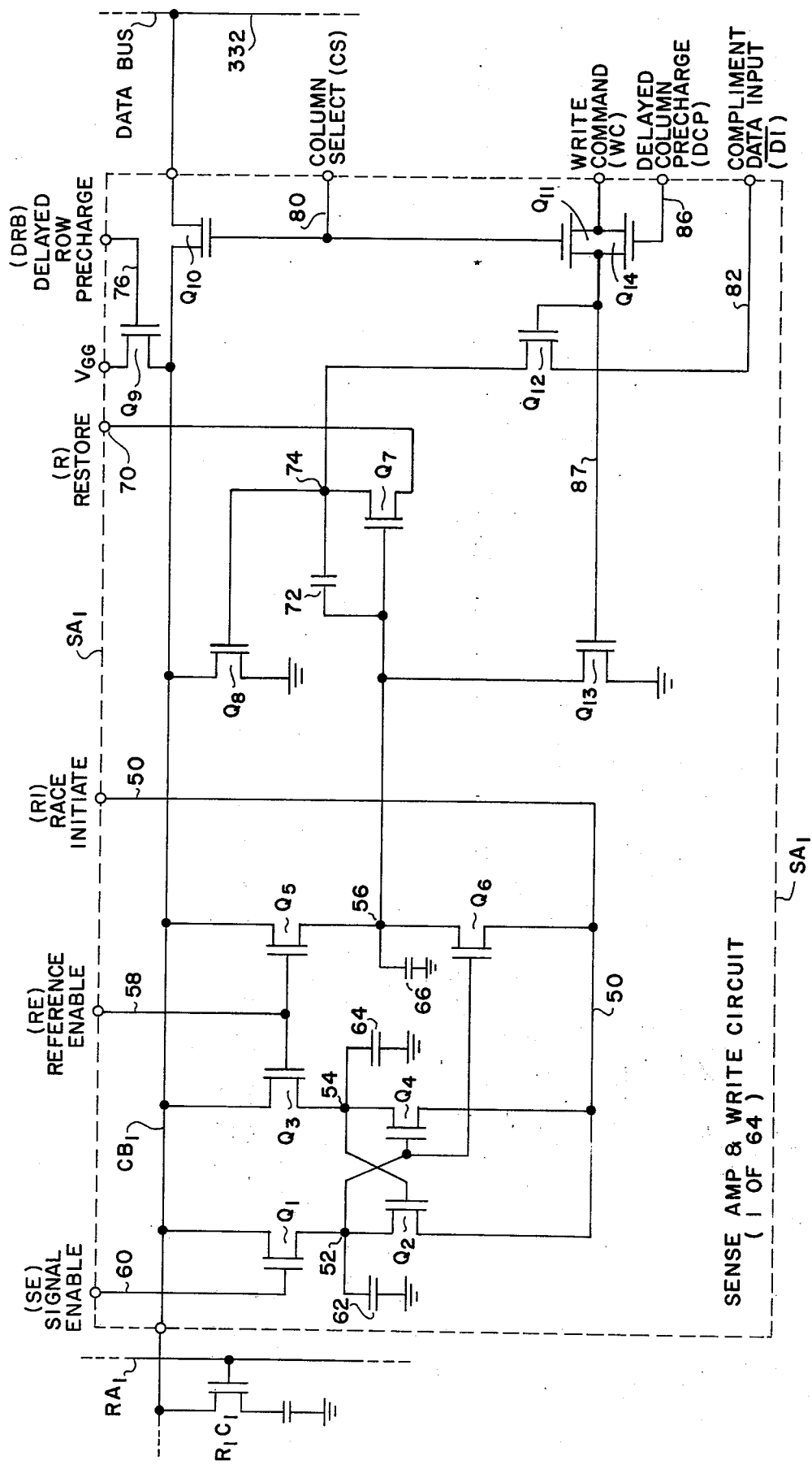
FIG. 2 is a schematic circuit diagram of one of sixty-four sense amp and write circuits of the random access memory of FIG. 1.

Each of the sense amp and write circuits $SA_1 - SA_{64}$ includes the circuitry illustrated in the dotted outline in FIG. 2 and designated by the reference characters $SA_1$. Each sense amp is controlled by a number of signals from the row clock and control circuit 22, which are arranged along the top of FIG. 2, and by signals from the column clock and control circuit 24, the data input latch 26, and the column decoder 20, which are arranged along the right-hand edge of FIG. 2. It should be noted that for convenience the control lines to the sense amplifiers and write circuits $SA_1$, $SA_2$ and $SA_{64}$ in FIG. 1 are arranged in the same order as would be the case if the circuit shown in FIG. 2 were rotated 90° counterclockwise.

The sense amp $SA_1$, for example, is comprised of transistors $Q_1$ and $Q_2$, $Q_3$ and $Q_4$, and $Q_5$ and $Q_6$, which are connected between the column bus $CB_1$ and a race initiate terminal 50. Capacitive nodes 52, 54 and 56 are thus formed between transistors $Q_1$ and $Q_2$, $Q_3$ and $Q_4$, and $Q_5$ and $Q_6$, respectively, which have small storage capacitance as represented by capacitors 62, 64, and 66. The gates of transistors $Q_3$ and $Q_5$ are connected to the reference enable line 58 and the gate of transistor $Q_1$ is connected to the signal enable line 60. The gate of transistor $Q_4$ is controlled by node 52, and the gate of transistor $Q_2$ is controlled by node 54. The relative sizes of transistors $Q_2$ and $Q_4$ and/or the size of capacitors 62 and 64 are selected such that if nodes 52 and 54 are at the same voltage when race initiate line 50 is switched from near $V_{gg}$ to ground, as will hereafter be described in greater detail, node 54 will discharge at a faster rate to ensure that transistor $Q_2$ is switched off and that transistor $Q_4$ remains on. Conversely, if node 52 is at predetermined voltage lower than node 54, when the race initiate line 50 is switched from near $V_{gg}$ to ground, transistor $Q_2$ will remain on and transistor $Q_4$ will be switched off. It will be noted that node 52 also controls the gate of transistor $Q_6$. Thus, if node 52 remains high, node 56 follows node 50 to ground. Conversely, if node 52 follows node 50 to ground, node 56 remains near $V_{gg}$. Node 56 is connected to the gate of transistor $Q_7$ which connects the restore node 70 to the gate of transistor $Q_8$. A bootstrap capacitor 72 connects node 74 to node 56 and operates in a bootstrap manner to keep transistor $Q_7$ full on in response to the restore node 70 going to a high voltage when node 56 is high.

Transistor $Q_9$ connects column bus $CB_1$ to the voltage supply $V_{gg}$ to precharge the column bus to $V_{gg}$ less one threshold during the precharge cycle. The gate of transistor $Q_9$ is controlled by the delay row precharge line 76. Transistor $Q_{10}$ connects the column bus $CB_1$ to the data bus and is controlled by the column select input line 80. The column select input line 80 also is connected to the gate of transistor $Q_{11}$ to enable the write command which is then connected to the gates of transistors $Q_{12}$ and $Q_{13}$ of the select sense amp only. Transistor $Q_{12}$ connects the complement data input line 82 to node 74, and transistor $Q_{13}$ discharges node 56 to ground when turned on. Transistor $Q_{14}$ is turned on by delayed column precharge 86 to bring node 87 to the grounded potential of write command node 80 during precharge time.

Figure 3:
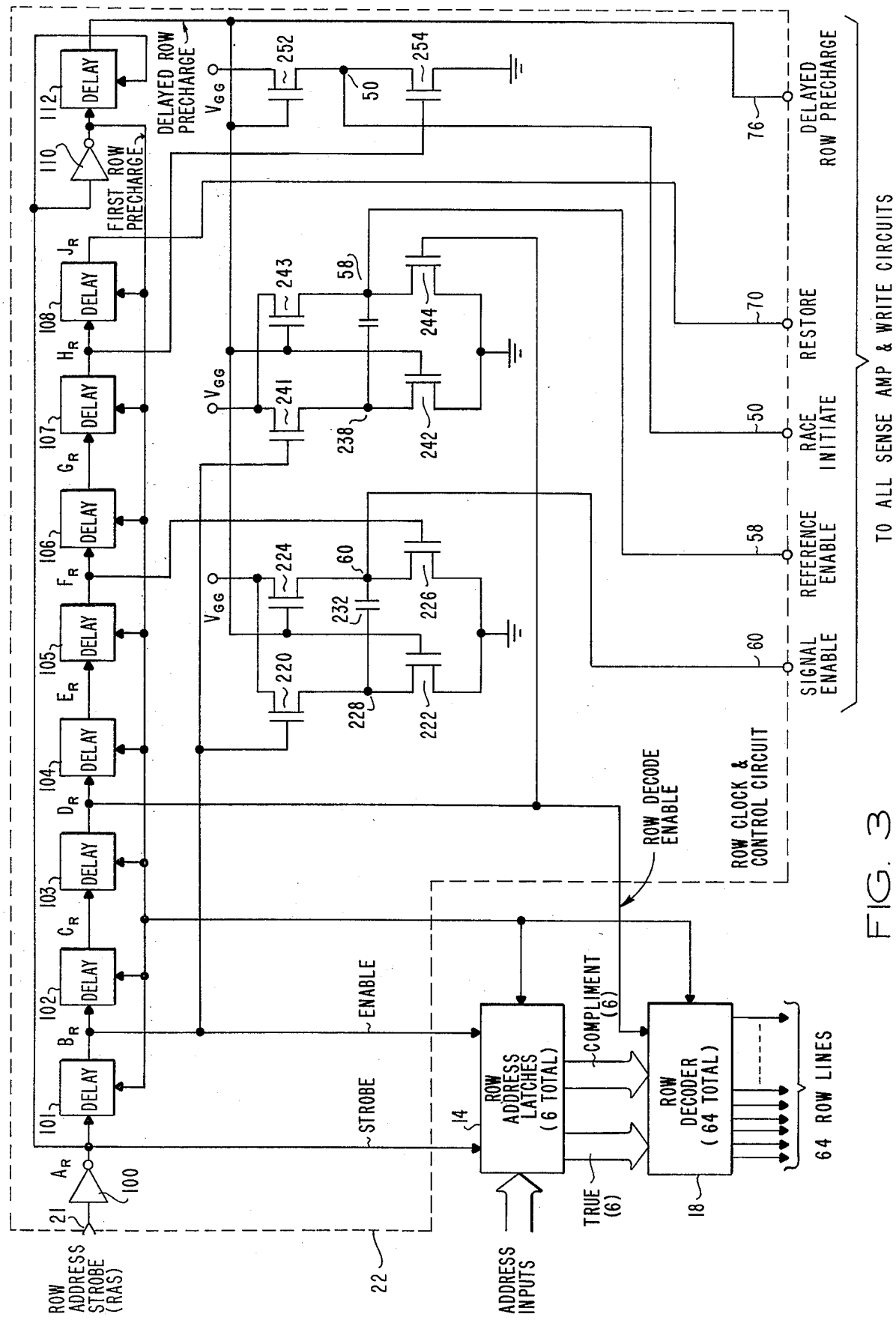
FIG. 3 is a schematic block diagram of the row clock and control circuit of the random access memory of FIG. 1.

The row clock and control circuit 22 is shown in detail in FIG. 3. A row address strobe clock input $\overline{RAS}$ is applied to an external pin 21 and then to an inverter 100. The output of the inverter 100 is fed to a cascade of eight delay stages 101 – 108. The output from inverter 100 is also applied to the input of an inverter 110, the output of which is applied to delay stage 112.

The output of inverter 110 is applied to the precharge inputs of delay stages 101 – 108, and to the input of a delay stage 112. The output of inverter 100 is also applied to the precharge input of delay stage 112.

Figure 7:
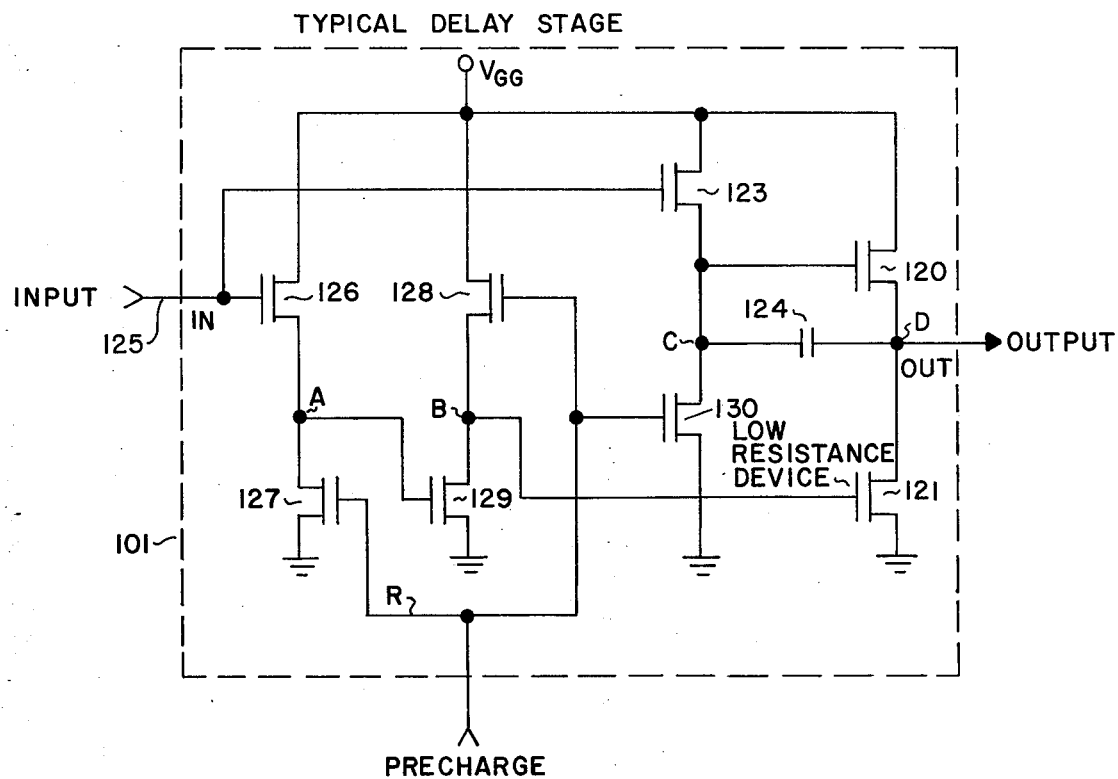
FIG. 7 is a schematic circuit diagram of a typical delay stage used in the clock and control circuits of FIGS. 3 and 5.

Each of the delay stages is illustrated by the schematic circuit diagram of FIG. 7. The delay stage 101, for example, is of the type described and claimed in co-pending U.S. application Ser. No. 337,132, entitled "Low Power, High Speed, High Output Voltage FET Delay-Inverter Stage", which was filed on March 1, 1973, and the assignee of the present invention. The delay stage 101 includes a bootstrap circuit comprised of transistors 120 and 121 connected in series between $V_{gg}$ and ground and forming an output node D. A transistor 123 connects $V_{gg}$ to the gate of transistor 120, which is indicated as node C. Capacitor 124 couples the output node D to node C. A timing input node 125 is connected directly to the gate of transistor 123 and to the input of a first timing stage comprised of transistors 126 and 127 connected between $V_{gg}$ and ground, the output of which is designated as node A. Node A is coupled to the input of a second timing stage comprised of transistor 128 and 129 connected between $V_{gg}$ and ground, which has an output node B. Node B is connected to the gate of transistor 121. Transistor 130 connects node C to ground. A precharge signal is applied to the gate of transistors 127, 128 and 130, which are referred to as node R because the precharge signal "resets" the stage.

Figure 8:
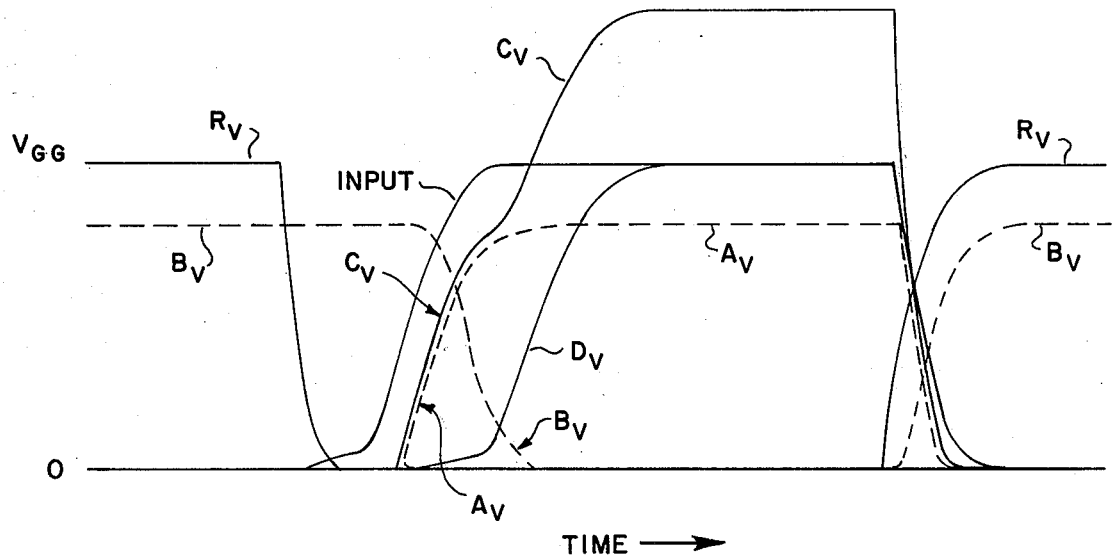
FIG. 8 is a timing diagram which serves to illustrate the operation of the delay stage of FIG. 7.

The operation of the delay stage of FIG. 7 is illustrated by the timing diagram of FIG. 8 where the curves represent the voltage on the nodes designated by the same reference characters as the curves followed by the subscript "v". For example, assume that the input 125 is low, i.e., at ground, and the precharge node R is high, i.e., at $V_{gg}$. Transistors 127, 128 and 130 would then be turned on causing nodes A and C to be at ground potential and node B to be one threshold below $V_{gg}$ which would turn transistor 121 on, holding the output node D at ground. Then before the input node 125 is brought high, the reset node R goes low as illustrated in FIG. 8. As a result, transistors 127, 128, and 130 are all turned off and transistor 123 turns on, thus charging node C toward $V_{gg}$, node B remaining high at this time. At the same time, node A goes high as transistor 126 turns on, causing transistor 129 to turn on and node B to now go toward ground, thus turning transistor 121 off a predetermined time interval later after node C has been substantially charged to $V_{gg}$ less one threshold while node D remains near ground. As transistor 121 turns off, output D begins to go high, which bootstraps node C above $V_{gg}$ as a result of capacitor 124, thus maintaining transistor 120 full on and allowing output node D to very rapidly go all the way to $V_{gg}$. When the precharge node R again goes high, nodes A, C and D go low and node B goes high.

Figure 4:
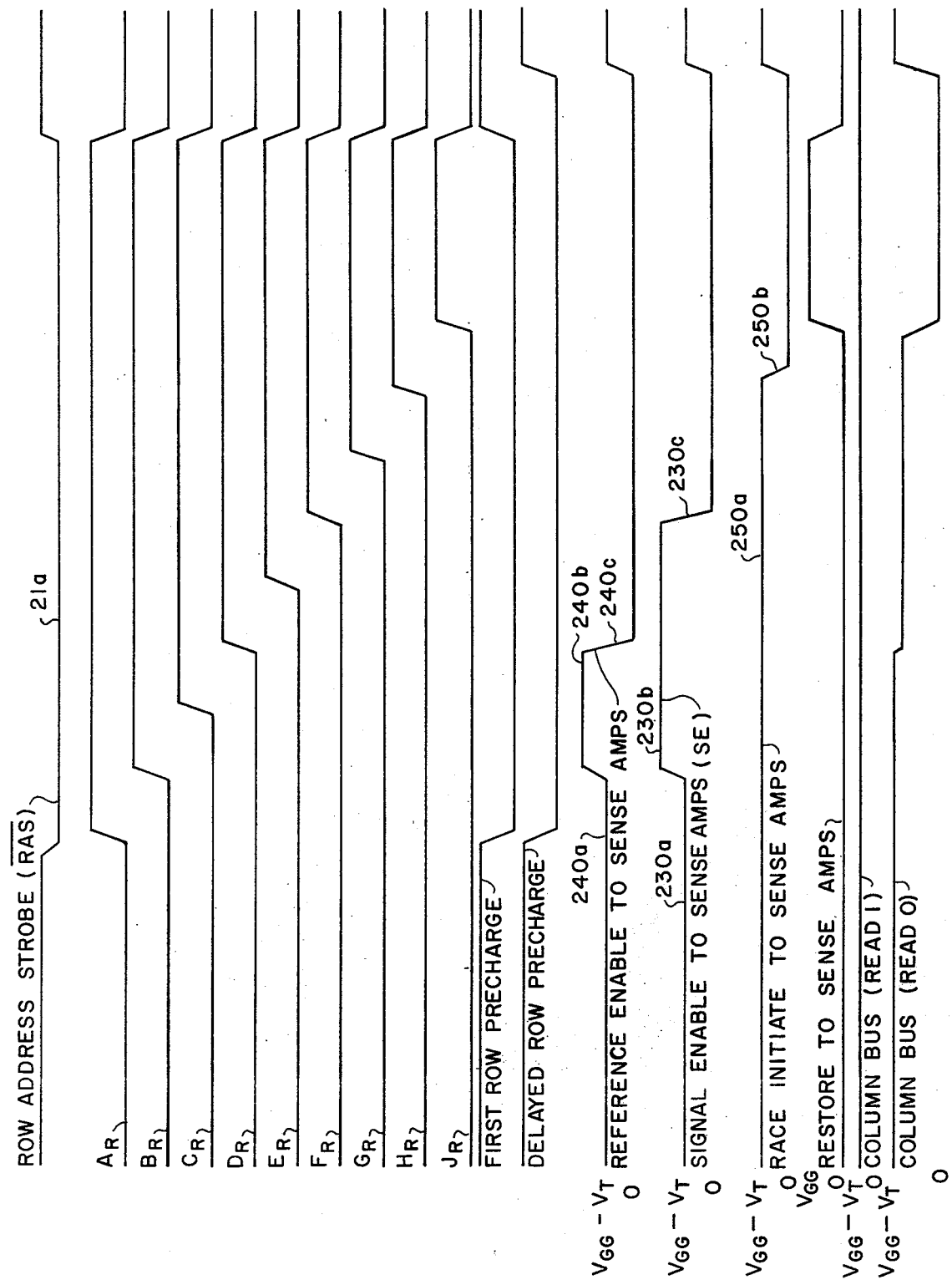
FIG. 4 is a timing diagram which serves to illustrate the operation of the row clock and control circuit of FIG. 3.

The row clock signals $A_R - J_R$ in FIG. 4 are representations of the voltages produced by inverter 100 and delay stages 101 – 108, respectively, in response to the row address strobe $\overline{RAS}$. The outputs of these components are designated by the same reference characters as the clock signals. In addition, the output of inverter 110 is indicated as the First Row Precharge (FRP) in FIG. 4 which is essentially the same as the row address strobe except at the higher level of $V_{gg}$, typically twelve volts, $V_{gg}$ rather than TTL voltage levels, typically less than three volts. The output of delay stage 112 is designated as the Delayed Row Precharge (DPR). The DPR signal goes from $V_{gg}$ to ground with the row address strobe $\overline{RAS}$ because delay stage 112 is reset by clock output $A_R$. The delayed row precharge DPR goes high one delay interval after the first row precharge goes high as illustrated in FIG. 4.

Referring once again to FIG. 3, clock output $A_R$ from inverter 100 and clock output $B_R$ from delay stage 101 are applied to the row address latch 14. The row address latch 14 is comprised of six bits, one of which is indicated generally by the reference numeral 14a in FIG. 9. The latch 14a is of the type described and claimed in co-pending U.S. application Ser. No. 441,500, entitled "Dynamic Data Input Latch and Decoder", filed Feb. 11, 1974, and assigned to the assignee of the present application. The latch 14a is comprised of cross coupled transistors 150, 151, 152, and 153. Transistors 150 and 151 are connected between an enable node 154 and ground, and transistors 152 and 153 are also connected between the enable node 154 and ground. The gates of transistors 150 and 153 are interconnected as are gates of transistors 152 and 151. Transistors 150 and 153 have a relatively low transconductance for a given source-to-gate voltage when compared to those of transistors 152 and 151. A true output node 156 is formed between transistors 150 and 151, and is coupled to gate node 164 by capacitor 157, and a complement output node 158 is formed between transistors 152 and 153, and is coupled to node 160 by capacitor 159. The gate node 160 of transistors 152 and 151 may be precharged to $V_{gg}$ less one threshold through transistor 162, while gate node 164 of transistors 150 and 153 may be precharged through transistor 166. The gates of transistors 162 and 166 are controlled by a precharge node 176. Node 160 is connected to ground by transistors 168 and 170 in series, the gate of 168 being the data input node, and the gate of transistor 170 being connected to the strobe node 172. Node 164 is connected to ground by transistor 174, the gate of which is connected to the complement output node 158.

When the precharge signal to node 176 goes to $V_{gg}$, nodes 160 and 164 are precharged to $V_{gg}$ less one threshold. Both the enable node 154 and the strobe node 172 are low so that transistor 170 and 174 are turned off. Transistor 168 is turned on by a logic "1" input or off by a logic "0" input. Assume that the data input is a logic "1". When the precharge input goes low, transistors 162 and 166 are turned off, trapping the precharge voltage on nodes 160 and 164. The strobe node 172 is first brought high which turns transistor 170 on, then the enable node 154. Since is was assumed that data input transistor 168 was turned on by a logic "1" input, a conductive path from node 160 to ground is established. Node 160 is then discharged to ground before the enable signal occurs. When the enable does occur, transistors 150 and 153 are on while transistors 151 and 152 are off. With transistor 150 on and 151 off, the true output, node 156, follows the enable signal, node 154, all the way to $V_{gg}$ since bootstrap capacitor 157 maintains the gate drive on transistor 150 during the switching transient. Furthermore, with transistor 152 off and 153 on, the complement output, node 158, remains at ground.

Assume now that the data input is at a logic "0". In this case no conductive path is formed between node 160 and ground. Both nodes 160 and 164 are at the same high voltage when the enable signal occurs, so transistors 150, 151, 152 and 153 are all conductive.

Since the transconductance of transistors 151 and 152 are greater than those of 150 and 153, node 158 rises at a faster rate than does node 156, typically twice as fast. Node 158 reaches transistor threshold voltage while node 156 is still well below threshold. When threshold is reached on node 158, transistor 174 becomes conductive, discharging node 164. With node 164 discharged, transistors 150 and 153 are turned off. With 151 turned on and 150 turned off, the true output, node 156 returns to ground without ever reaching threshold voltage. In the meantime, transistor 153 is off and 152 is conductive so that the complement output, node 158, follows the enable signal all the way to $V_{gg}$ since the turn on voltage of transistor 152 is maintained by bootstrap capacitor 159.

Thus, in the event of an input "0" the complement output follows the enable signal to $V_{gg}$ with the true output remaining essentially at ground while with a logic "1" input the true input follows the enable signal to $V_{gg}$ with the complement output remaining essentially at ground.

Figure 10:
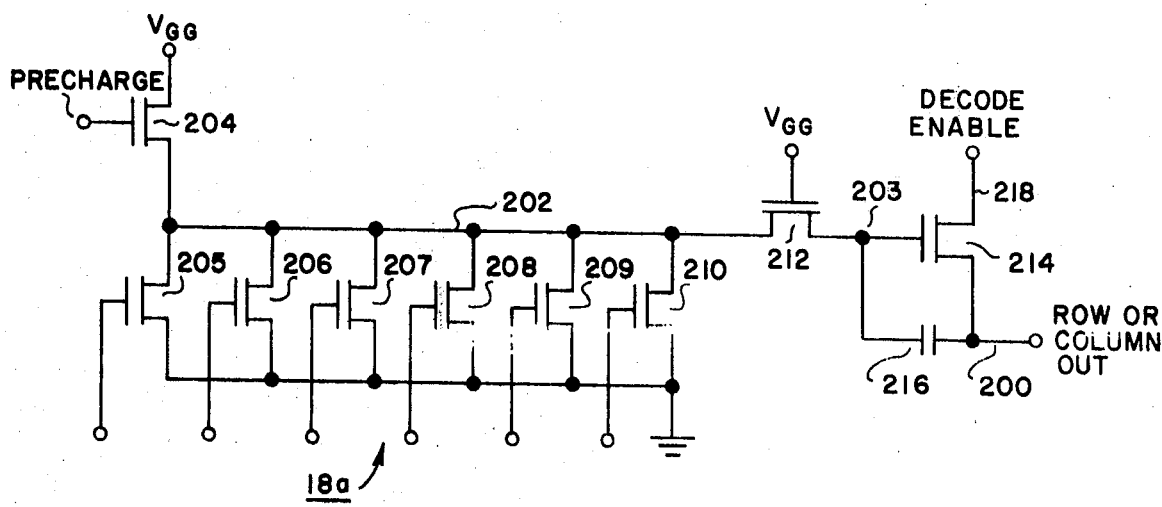
FIG. 10 is a schematic circuit diagram of a decoder used in both the row and column decode circuits of the random access memory of FIG. 1.

The twelve outputs, six true and six complement, from the six bits of the row address latch are applied to sixty-four row detectors indicated collectively by the reference numeral 18, one of which is indicated generally by the reference numeral 18a in FIG. 10. The decoder 18a is also described and claimed in the above referenced application Ser. No. 441,500. The output node 200 of each decoder is connected to one of the row address lines $RA_1 - RA_{64}$. Precharge nodes 202 and 203 are precharged to $V_{gg}$ through a transistor 204 during the row precharge period, and specially the output from inverter 110. Six transistors 205 – 210 connect precharge node 202 to ground. The gates of the transistors 205 – 210 of each row decoder are connected to a unique combination of six of the true or complement outputs from the row address latches 14. A transfer transistor 212 connects the precharge node 202 to precharge node 203 which is the gate of a transistor 214. Transistor 214 connects a decode enable node 218 to the output node 200. A bootstrap capacitor couples the output node 200 back to node 203. The gate of transistor 212 is connected to $V_{gg}$ and functions to permit the bootstrap capacitor 216 to drive the gate of transistor 214 above $V_{gg}$, isolating the capacitive loading of node 202 from the bootstrap node 203.

It is important to note that both the true and complement outputs of the row address latches 14 are low during precharge because transistors 150, 151, 152 and 153 are turned on and the enable node 154 is at ground. Accordingly, all six transistors 205 – 210 are turned off in each of the sixty-four row decoders. This allows nodes 202 and 203 to be precharged to $V_{gg}$ less one threshold during the precharge cycle. After the precharge cycle goes low, the address data is output from the row address latches 14 so that at least one of the transistors 205 – 210 for sixty-three of the sixty-four decoders is turned on and the precharge nodes 202 and 203 of those sixty-three decoders are discharged. However, all six transistors 205 – 210 of one of the decoders remain off so that nodes 202 and 203 remain high and transistor 214 remains turned on. Then as the decode enable node 218 goes high, the output 200 also goes high. As the output node goes high, the voltage is bootstrapped by capacitor 216 back to node 203 to maintain transistor 214 full on and enable the node 200 to go all the way to $V_{gg}$. Transistor 212 isolates node 202 from node 203 during the bootstrap phase.

Referring once again to FIG. 3, it will be noted that row clock output $A_R$ provides the strobe to the row address latches while row clock output BR provides the enable signal. Row clock output $D_R$ provides the row decode enable signal to the row decoders 18.

The Signal Enable signal (SE) to the sense amps is generated from row clock outputs $B_R$, $F_R$, and delayed row precharge DRP by the circuit comprised of transistors 220, 222, 224 and 226. Transistor 220 connects $V_{gg}$ to a node 228 and transistor 222 connects node 228 to ground. Similarly, transistor 224 connects node 60 to $V_{gg}$ and transistor 226 connects node 60 to ground. A capacitor 232 couples nodes 228 and 60. The gate of transistor 220 is connected to row clock output $B_R$. The gates of transistors 222 and 224 are connected to the delayed row precharge DRP from delay stage 112, and the gate of transistor 226 is controlled by row clock output $F_R$. Node 60 is the signal enable node to all sixty-four sense amplifier and write circuits $SA_1 - SA_{64}$.

During the delayed row precharge DRP, transistor 224 is turned on to charge node 60 to $V_{gg}$ less one threshold, and transistor 222 is turned on to discharge node 228 to ground. Transistors 220 and 226 are both turned off. Shortly after the delayed row precharge goes low, turning transistors 222 and 224 off, clock signal $B_R$ goes high, turning transistor 220 on, thus switching node 228 to a voltage equal to $V_{gg}$ less one threshold. Capacitor 232 then drives node 60, which was previously at $V_{gg}$ less one threshold as represented by segment 230a in FIG. 4, to a much higher voltage approximately to two $V_{gg}$ minus two thresholds as represented by segment 230b. This condition continues until clock $F_R$ goes high to turn transistor 226 on. This immediately discharges node 60 to ground as represented by edge 230c in FIG. 4. As will hereafter be described in greater detail, the high voltage level 230b of the Signal Enable clock signal is important in the operation of the sense amps, as well as the timing of edge 230c.

The reference enable signal is produced on output node 58 of a circuit comprising of transistors 241 – 244 which is identical to that heretofore described in connection with signal enable output node 60. The voltage on node 58 is at $V_{gg}$ less one threshold as represented by segment 240a in FIG. 4 until clock pulse $B_R$ goes high which switches transistor 241 on and produces the higher voltage as represented by segment 240b. Then when clock pulse $D_R$ goes high, transistor 244 is turned on to discharge node 58 and produce the falling edge 240c.

The race initiate signal to the sense amps is produced on node 50 by the operation of transistors 252 and 254 and clock signals $H_R$ and the delayed row precharge DRP. During the delayed row precharge DRP, which is applied to the gate of transistor 252, node 50 is charged to $V_{gg}$ less one threshold, as represented by segment 250a in FIG. 4. After the row precharge goes low, node 250 remains charged to this potential due to the stray capacitance of the node. Then when clock pulse $H_R$ goes high, transistor 254 is turned on, discharging node 50 to ground as represented by edge 250b in FIG. 4.

The restore signal applied to the sense amps is merely the output $J_R$ from delay stage 108. As previously mentioned, the delayed row precharge (DRP) in FIG. 4 is the output of delay stage 112 and is used to assure that data on the column buses is not changed before the row address line RA goes low.

Figure 5:
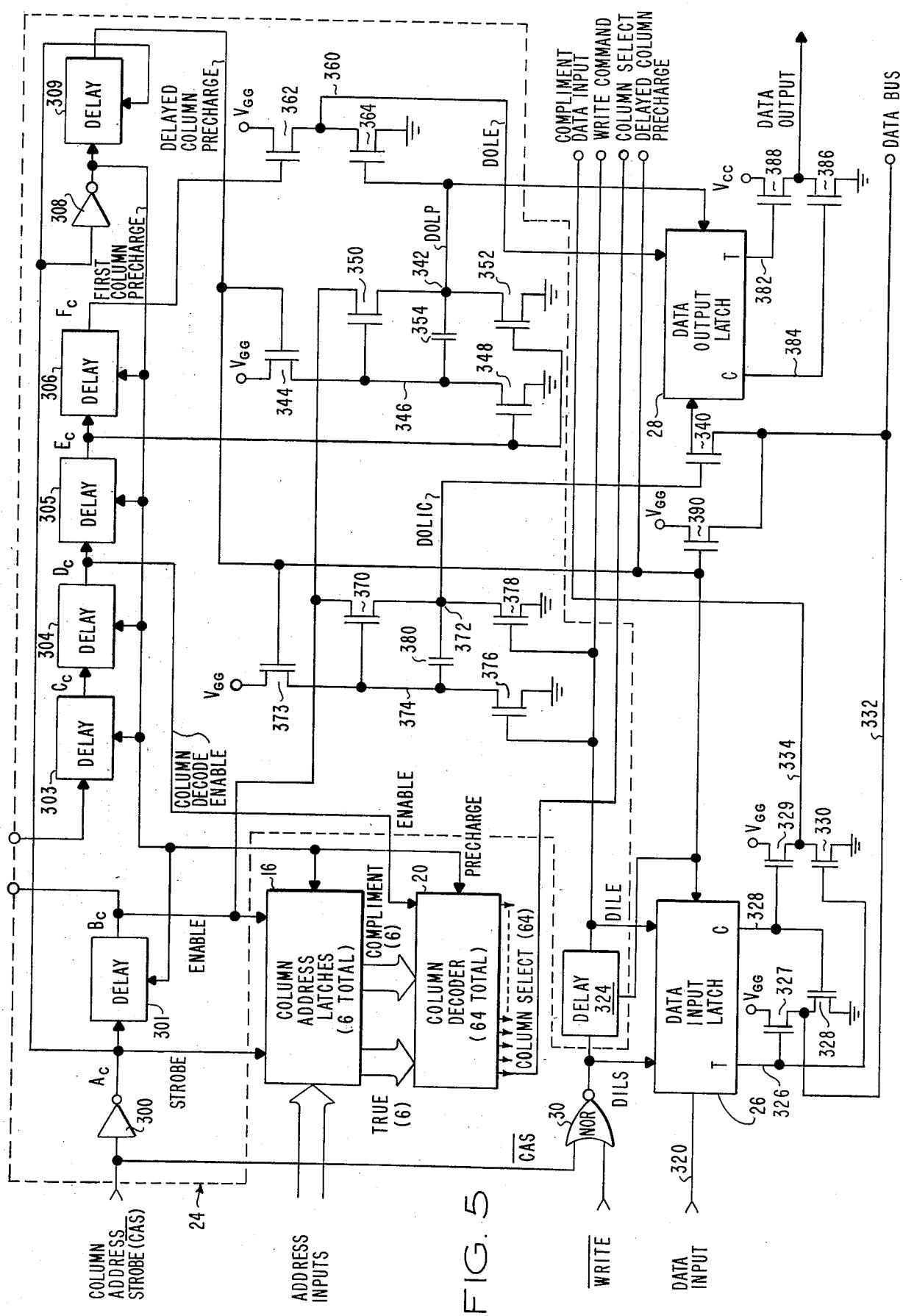
FIG. 5 is a schematic block diagram of the column clock and control circuit of the random access memory of FIG. 1.

Referring now to FIG. 5, the column clock and control circuit 24 of FIG. 1 is represented by the portion of the circuit within the dotted outline designated by the reference numeral 24. Reference should also be made to the timing diagram of FIG. 6. The column address strobe $\overline{CAS}$ is applied to a cascade of circuits comprising an inverter 300, delay stage 301, chip select latch 32 and delay stages 303 – 306. The output of inverter 300 is also applied to a second inverter 308 the output of which is fed into a delay stage 309. The outputs of inverter 300 and delay stages 301 and 303 – 306 are designated by the characters $A_C - F_C$ in both FIGS. 5 and 6. The output of inverter 308 is designated as the first column precharge FCP of FIG. 6 and is used to reset the delay stages 301 and 303 – 306 as well as the column address latching input buffers 16, the chip select latch 32 and column decoders 20. Signal $A_C$ is used to reset delay stage 309, and the output of delay stage 309 is the delay column precharge DCP shown in FIG. 6. The delay stages 301, 303 – 306 and 309 are the type illustrated in FIG. 7.

Figure 9:
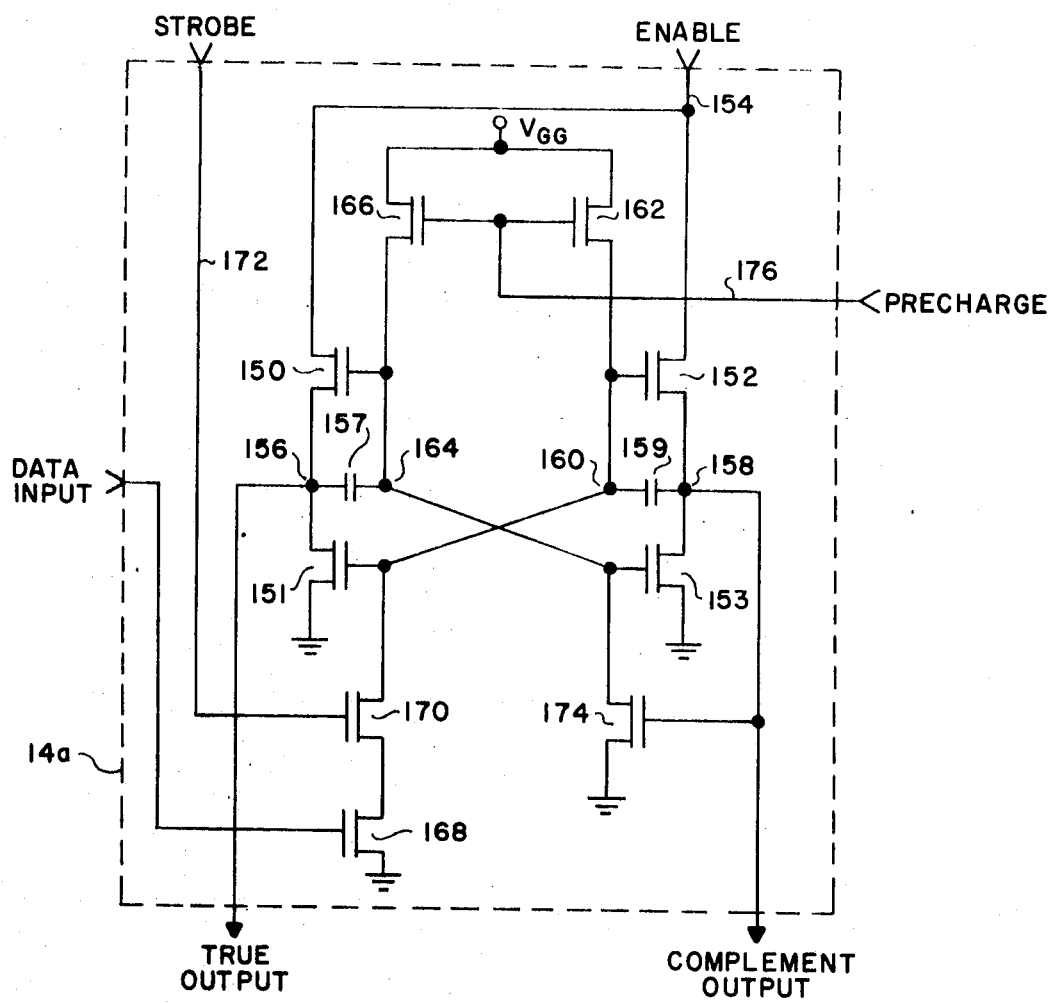
FIG. 9 is a schematic circuit diagram of a typical input latch used in the random access memory of FIG. 1.

The column address latches 16 are identical to the row address latches 14 described in FIG. 9, and data on the six address inputs are latched up in response to the sequence of signals $A_C$ and $B_C$ which are applied to the strobe and to the enable inputs, respectively. The column decoder 20 is identical to the row decoder 18. Clock output $D_C$ is connected to the enable terminals of the sixty-four column decoders so that one of the decoder outputs goes high approximately coincident with the clock output $D_C$. The outputs of the decoders are connected to the column select nodes 80 of the respective sense amps and write circuits.

Data is input to the chip by way of a data input pin 320 to a data input latch 26. The data input latch is also identical to that illustrated in FIG. 9. The data input latch is precharged by the delayed column precharge DCP from delay stage 309. Data is stored in the data input latch 26 in response to a positive edge from NOR gate 30 which occurs when both the column address strobe input $\overline{CAS}$ and the $\overline{WRITE}$ inputs go low. The output of NOR 30 is applied to a delay stage 324 of the type heretofore described which then produces the enable signal to the data input latch 26.

The true and complement outputs 326 and 328, respectively, of the data input latch, are applied to buffer stages comprised of transistors 327 and 328 for the true output, and 329 and 330 for the complement output. The output from the true data buffer is connected to the data bus 332, while the output 334 of the complement data buffer provides the complement data input DI to the sense amplifier and write circuits.

The output from delay 324 also provides the write command WC to the sense amplifier and write circuits.

Figure 11:
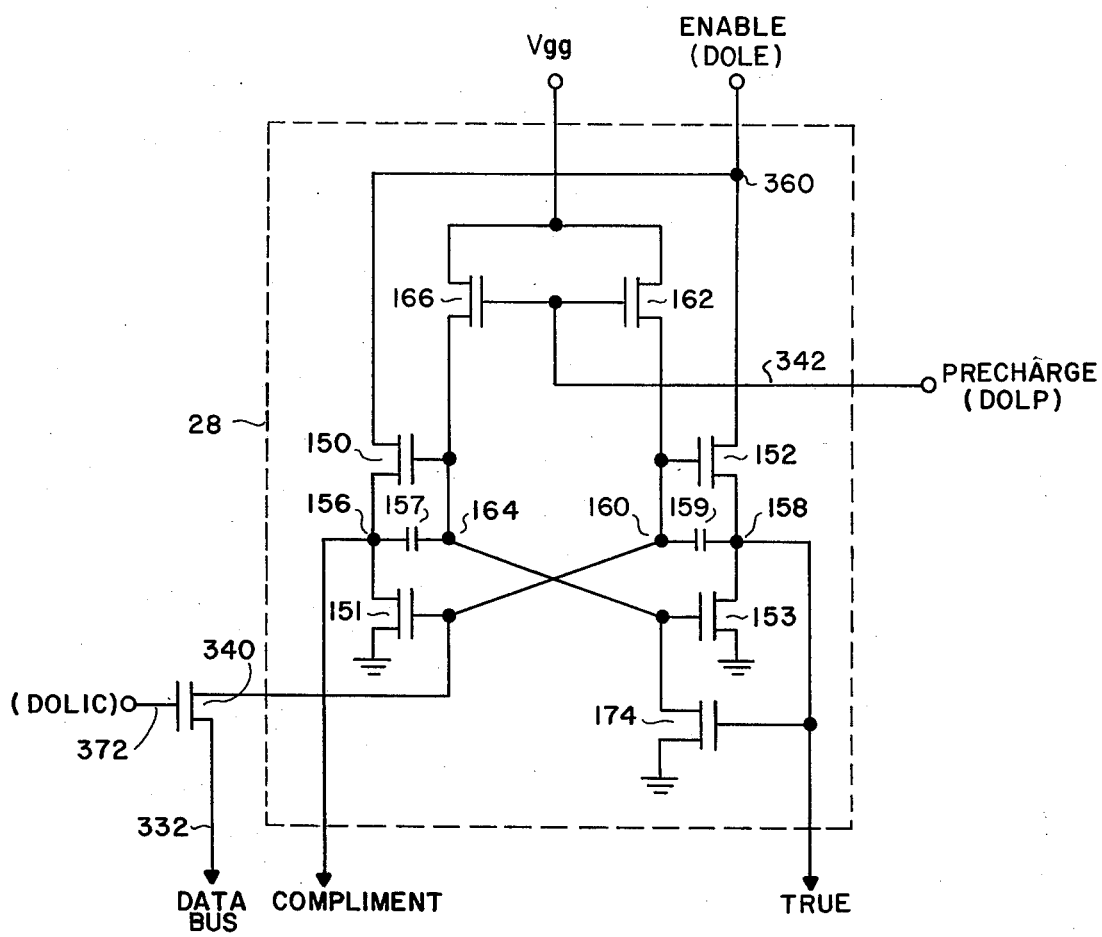
FIG. 11 is a schematic circuit diagram illustrating the data output latch of the circuit of FIG. 1.

The data output latch 28 is shown in detail in FIG. 11. The data output latch 28 is identical in most respects to the typical latch illustrated in FIG. 9 and accordingly corresponding components are designated by the same reference characters. However, it will be noted that transistor 340 connects node 160 to the data bus 332. It will also be noted that the true and complement outputs are reversed when compared to the typical circuit illustrated in FIG. 9. This is because data from the data bus to node 160 of the output latch is non-inverting as contrasted to the inverting nature of transistor 168 in discharging node 160 of the input latch. If the data bus is high when the enable signal DOLE goes high, node 158 follows enable high and transistor 174 discharges node 164 as before. If the data bus is low and the gate node 372 of transistor 340 is high, transistor 340 conducts to bring node 160 low and node 156 follows enable high. Operation is exactly as previously described except for the means of discharging node 160.

Data is input to the data output latch 28 from the data bus 332 through isolation transistor 340. The precharge signal DOLP to the data output latch is provided by node 342 in FIG. 5 which is also designated DOLP to correspond to the time line of the same designation in FIG. 6. This precharge signal is generated by the circuit including transistors 344, 348, 350 and 352. Transistor 344 charges node 346 to $V_{gg}$ less one threshold during the delayed column precharge signal during which time $B_C$ is at ground. Node 342 goes high as a result of clock output $B_C$ passing through transistor 350 with capacitor 354 bootstrapping node 346 above $V_{gg}$ to keep transistor 350 on. The data output latch precharge node 343 (DOLP) remains high until clock output $E_C$ goes high. When $E_C$ goes high, transistor 348 conducts to bring the bootstrapped node 346 to ground, turning off transistor 350, while transistor 352 conducts to bring the bootstrapped node 346 to ground, turning off transistor 350, while transistor 352 conducts to bring node 342 to ground, this being possible since transistor 350 is off. Thus, it will be noted that the data output latch precharge signal DOLP is high only during the interval from clock pulse $B_C$ to clock pulse $E_C$. The data output latch enable signal DOLE is generated on node 360 as a result of the operation of transistors 362 and 364. As a result of clock pulse $F_C$, transistor 362 is turned on to charge node 360 all the way to $V_{gg}$, if $F_C$ is taken from node C of the delay circuit. This charge remains on node 360 until node 342, the data output latch precharge, goes high, at which time transistor 364 turns on and discharges node 360 to ground. It should be noted that this does not occur until the next cycle so valid data is present at the output between cycles.

A data output latch isolation control signal DOLIC is produced by the circuit including transistors 370, 373, 376 and 378. Transistor 370 connects node 372 to the output of delay 301. Node 374, which controls the gate of transistor 370, is charged to $V_{gg}$ less one threshold during the delayed column precharge signal DCP, but may be discharged to ground by transistor 376 in response to the write command WC from the output of delay 324. Transistor 378 would then discharge node 372 to ground in response to the same write command WC from delay stage 324. Capacitor 380 bootstraps node 374 above $V_{gg}$ in response to node 372 going to $V_{gg}$ when output $B_C$ of delay 301 goes high. In the event transistors 376 and 378 are not turned on in response to a $\overline{WRITE}$ signal, mode 372 ultimately goes low as clock output $B_C$ goes low during precharge because node 374 remains high and transistor 370 remains on.

The true and complement outputs 382 and 384 of the data output latch control the gates of transistors 388 and 386, respectively, which form the data output buffer. The center node between transistors 386 and 388 is the data output for the chip.

Transistor 390 precharges the data bus to $V_{gg}$ less one threshold during the delayed column precharge signal DCP for purposes which will presently be described.

The chip select latch 32 is identical to the latch illustrated in FIG. 9 except that two transistors in parallel replace the single device 168. The inputs to these two transistors are the chip select $\overline{CS}$ and the row address strobe $\overline{RAS}$ signals. The chip will be selected only if both these inputs are low, causing the complement chip select latch output to go high in response to clock signal $B_C$. The complement output from the chip select latch 32 is the input to delay stage 303. If this input does not go high, delay stage 303 cannot have an output. No outputs are produced from delay stages 303 – 306 unless the chip has been selected and the row address strobe $\overline{RAS}$ and the column address strobe $\overline{CAS}$ are both applied to the chip. Lack of these clock outputs disables both the write function and the data output function as will presently be described.

Figure 12:
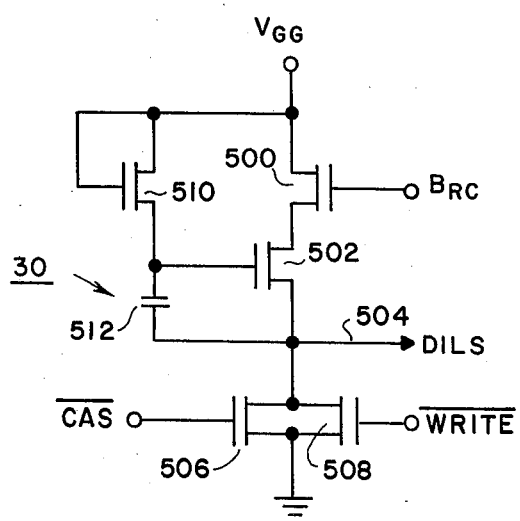
FIG. 12 is a schematic circuit diagram illustrating a NOR gate of the circuit of FIG. 1.

The NOR gate 30 is illustrated in detail in FIG. 12. The gate 30 comprises transistors 500 and 502 connected in series between $V_{gg}$ and an output node 504 which produces the data input latch strobe DILS. Node 504 is connected to ground through parallel transistors 506 and 508. The gate of transistor 506 is connected to the column address strobe $\overline{CAS}$ input pin and the gate of transistor 508 is connected to the $\overline{WRITE}$ input pin. The gate of transistor 502 is connected through transistor 510 to $V_{gg}$ and by bootstrap capacitor 512 to the output node 504. The gate of transistor 510 is connected to $V_{gg}$. As previously described, delay 101 is identical to the typical delay stage illustrated in FIG. 7, and the gate of transistor 500 is connected to node C in FIG. 7 and accordingly is designated as clock $B_{RC}$. As will be noted in FIG. 8, node C goes substantially above $V_{gg}$ in response to the row address strobe. However, node C is low at all other times so that no power is consumed by NOR gate 30 except after a row address strobe $\overline{RAS}$ is received by the chip to cause clock signal $B_{RC}$ to go high, transistor 500 acting as a switch and transistor 502 acting as a bootstrapped high performance load. The output node 504 will remain low as long as either $\overline{CAS}$ or $\overline{WRITE}$ is high. When the last of $\overline{CAS}$ or $\overline{WRITE}$ goes low, node 504 moves high, bootstrapping the gate of transistor 502 above $V_{gg}$ and allowing node 504 to go all the way to $V_{gg}$.

FIG, 13 is a timing diagram indicating the relationship between the signals applied to the twelve external connections to the chip 10, other than the four power supply pins to the package, during a typical read-modify-write cycle. The row address strobe $\overline{RAS}$ automatically results in all of the events illustrated by the timing diagram of FIG. 4. Similarly, the occurrence of the column address strobe $\overline{CAS}$ automatically results in all of the events illustrated by the timing diagram of FIG. 6, conditioned upon the state of the chip select ($\overline{CS}$) pin and the $\overline{WRITE}$ pin. In general, the row address strobe $\overline{RAS}$, which is represented by an edge transitioning from positive voltage to ground, results in the address information on the six address pins being latched into the row address latch, a single row address line $RA_1 - RA_{64}$ being activated, the data being destructively read from each of the storage cells of that row into the respective sense amplifier where the data is sensed, stored and replaced in the storage array after destructive read out. The occurrence of the negative going edge of the column address strobe $\overline{CAS}$, a short time later latches the new column address information on the six address pins into the column address latch 16 and the status of the chip select pin $\overline{CS}$ into the chip select latch 32. The column address strobe may also initiate a write cycle if the $\overline{WRITE}$ input pin is low as will hereafter be described. Assuming that the chip has been selected as indicated by the $\overline{CS}$ pin being low, data is then transferred to the data output latch 28 from the addressed sense amplifier $SA_1 - SA_{64}$. After the transfer of data to the data output latch, the signal at the data input is transferred into the data input latch when the $\overline{WRITE}$ pin transitions from high to low. This data is then automatically transferred to both the addressed cell as well as to the addressed sense amp. Upon the cessation of both the row address strobe $\overline{RAS}$ and column address strobe $\overline{CAS}$, a precharge condition occurs which places the entire chip in a standby low power mode preparatory to a new cycle.

A read cycle may occur without a write cycle, merely by keeping the $\overline{WRITE}$ input high during the period the row address strobe $\overline{RAS}$ is low. Or the read cycle may be bypassed by bringing the $\overline{WRITE}$ input low before the time $\overline{CAS}$ goes low.

In accordance with another important aspect of the present invention, the column address strobe $\overline{CAS}$ can be cycled any number of times during the period the row address strobe $\overline{RAS}$ is low in order to reduce the access time while also reducing the power consumption. This is possible any time a sequence of address bits share a common row address, whether for read only, write only or read-modify-write cycles in any combination. This is referred to herein as the "Page Mode" and is made possible by the fact that following a row address strobe the data of each cell in the addressed row is transferred and stored in each of the respective sense amps where the data from any number of sense amps can be read or modified without terminating a row cycle. A write command writes new data into the sense amp for later recall while still in the page mode and also into the storage matrix cell, for recall when a row $\overline{RAS}$ occurs. A refresh of all sixty-four bits in the address row occurs automatically in response to a row address strobe. When the chip select $\overline{CS}$ pin stays high, indicating that the chip is not selected, the data output goes to an "open" state. If the chip is selected and the $\overline{WRITE}$ input is low before the column address strobe, producing a write cycle but no read cycle, the data output goes to a logic "1" state. Of course, if the chip is selected and the $\overline{WRITE}$ input is high, the data output properly reflects the data stored in the addressed cell. Another important advantage of this invention is that the data on the data output remains valid from clock edge $F_C$ of one $\overline{CAS}$ strobe cycle until $B_C$ of the next $\overline{CAS}$ strobe cycle.

Referring now to FIGS. 3, 4, 9 and 10, the first row precharge FRP and delayed row precharge DRP signals are both high prior to the occurrence of the row address strobe $\overline{RAS}$. As a result, the outputs of delay stages 101 – 108 are low, and nodes 160 and 164 of the row and column address latches and nodes 202 and 203 of the row decoder are high. Each of the column buses $CB_1$ are precharged to $V_{gg}$ minus one threshold as a result of transistor $Q_9$ in FIG. 2 being turned on. The delayed row precharge DRP also turns transistors 224, 243 and 252 on (see FIG. 3) so that nodes 60, 58 and 50 are precharged to $V_{gg}$ less one threshold as represented by segments 230a, 240a and 250a (see FIG. 4), and also turns transistors 222 and 242 on to discharge nodes 228 and 238 to ground.

On the occurrence of the negative going edge of the row address strobe $\overline{RAS}$, the first row precharge FRP and the delayed row precharge DRP both go low. This turns transistors 162 and 166 (see FIG. 9) of the row address latches of and turns transistor 204 (see FIG. 10) of the row decoders off. The falling edge of the delayed row precharge DRP turns transistors 224, 243 and 252 off (see FIG. 3), trapping the precharge voltage on nodes 60, 58 and 50, and turns transistors 222 and 242 off to isolate nodes 228 and 238 from ground. Transistors $Q_9$ (see FIG. 2) are also turned off, trapping the charge on the respective column buses $CB_1 - CB_{64}$.

The row address strobe then initiates the sequence of positive going clock edges $A_R - J_R$. Clock edge $A_R$ strobes the row address latches by turning transistors 170 on. Clock edge $B_R$ enables the row address latches causing the six latches to go to strobe states representative of the states of the six address lines which are connected to the gates of transistors 168 of the six latches.

At clock edge $B_R$, transistors 220 and 241 (see FIG. 3) are turned on to charge nodes 228 and 238 to $V_{gg}$ less one threshold. This voltage is capacitively transferred to nodes 60 and 58 which go substantially above $V_{gg}$, as represented by segments 230b and 240b in FIG. 4. The high voltage levels on the reference enable nodes 58 and the signal enable nodes 60 turn transistors $Q_1$, $Q_3$ and $Q_5$ (see FIG. 2) of all sixty-four sense amps $SA_1 - SA_{64}$ full on so that nodes 52, 54 and 56 are charged to the full potential of the respective column buses $CB_1 - CB_{64}$, which it will be recalled were precharged through transistors $Q_9$ during the period when the delayed row precharge DRP was high.

The reference enable signal on node 58 is then terminated in response to clock edge $D_R$ as transistor 244 is turned on to discharge node 58 to ground, as represented by edge 240c in FIG. 4. This turns transistors $Q_3$ and $Q_5$ of the sixty-four sense amps off, trapping the respective reference voltages on respective nodes 54 and 56 which was transferred from the respective column buses $CB_1 - CB_{64}$. Clock edge $D_R$ also enables the row decoder 18 by bringing node 218 (see FIG. 10) high, which immediately results in only one of the row address lines $RA_1 - RA_{64}$ going high. The other sixty-three row address lines remain low. Assume that the first row address line $RA_1$ is addressed and goes high. The row address line goes high at approximately the same time as transistors $Q_3$ and $Q_5$ are turned off, but slightly delayed since the reference enable signal is designed to transition to ground very quickly. If a logic "1" level, i.e., a high voltage level, is stored on the capacitor of a particular storage cell, then the respective column bus will remain at substantially the same precharge voltage. On the other hand, if a logic "0" level, i.e., a voltage near ground, is stored on the capacitor of a storage cell, then the voltage on the respective column bus will be decreased to a value determined by the relative size of the storage capacitor and that of the column bus. Then upon the occurrence of clock edge $F_R$, transistor 226 (see FIG. 3) is turned on to cause the signal enable node 60 to go to ground, thus turning transistors $Q_1$ of each of the sixty-four sense amps off, trapping the new voltages of the column buses on respective nodes 52 of the sense amps. Then upon the occurrence of clock edge $H_R$, transistor 254 (see FIG. 3) is turned on so that the race initiate node 50 goes to ground. As previously described, the transistors $Q_2$ and $Q_4$ (see FIG. 2) and/or the capacitors 62 and 64 are sized such that if the voltage stored on nodes 52 and 54 are the same, node 54 discharges at a more rapid rate than does 52 causing transistor $Q_2$ to turn off and transistor $Q_4$ to remain on, which is indicative of a logic "1" being stored in the respective storage cell. This results in transistor $Q_6$ being turned on to discharge node 56 to ground. Then upon the occurrence of clock edge $J_R$, which is the restore signal to node 70, transistors $Q_7$ and $Q_8$ will remain off so that the column bus $CB_1$ remains at the high voltage level representative of the logic "1" state. Conversely, if a logic "0" was stored in the storage cell $R_1C_1$, node 52 will have been reduced to a sufficient extent that when the race initiate node 50 goes low, transistor $Q_2$ will be switched on to discharge node 52 before transistor $Q_4$ is switched on to discharge node 54. This results in transistor $Q_6$ remaining off and node 56 remaining high, thus keeping transistor $Q_7$ on. Clock edge $J_R$, i.e. the restore signal, will thus pass through transistor $Q_7$, bootstrapping node 56 above $V_{gg}$, and turning transistor $Q_8$ on, fully discharging the respective column bus and capacitor of the respective storage cell thus restoring the logic "0" level of the storage cell which was destroyed by the transfer of charge from the precharged data bus.

It is important to note that after the clock edge $J_R$, the voltage on each of the sixty-four column buses $CB_1 - CB_{64}$ is the same as the data stored in the respective storage cells prior to the row address strobe $\overline{RAS}$. Further, the transistors $Q_8$ are held on where a logic "0" was read and off where a logic "1" was read until the row address strobe $\overline{RAS}$ again goes positive to initiate a precharge cycle (or until the data is modified by a write cycle. Thus is will be noted that the sixty-four sense amp and write circuits $SA_1 - SA_{64}$ function as a register into which the sixty-four bits of data stored on the storage cells of the addressed line is transferred for read, or can be modified for write, or read-modify-write cycles. As will presently be described, any number of such operations can be performed with multiple $\overline{CAS}$ cycles during a single $\overline{RAS}$ cycle, which is the page mode operation.

When the row address strobe $\overline{RAS}$ goes high, the selected row address line again goes low, turning all sixty-four transistors of the storage cells off and trapping the data on the respective column buses $CB_1 - CB_{64}$ on the capacitors of the respective storage cells. Thus, it will be noted that all sixty-four cells of a row are automatically refreshed in response to a row address strobe $\overline{RAS}$, which can occur without being followed by a column address strobe $\overline{CAS}$ in order to periodically refresh the dynamic storage cells.

Figure 6:
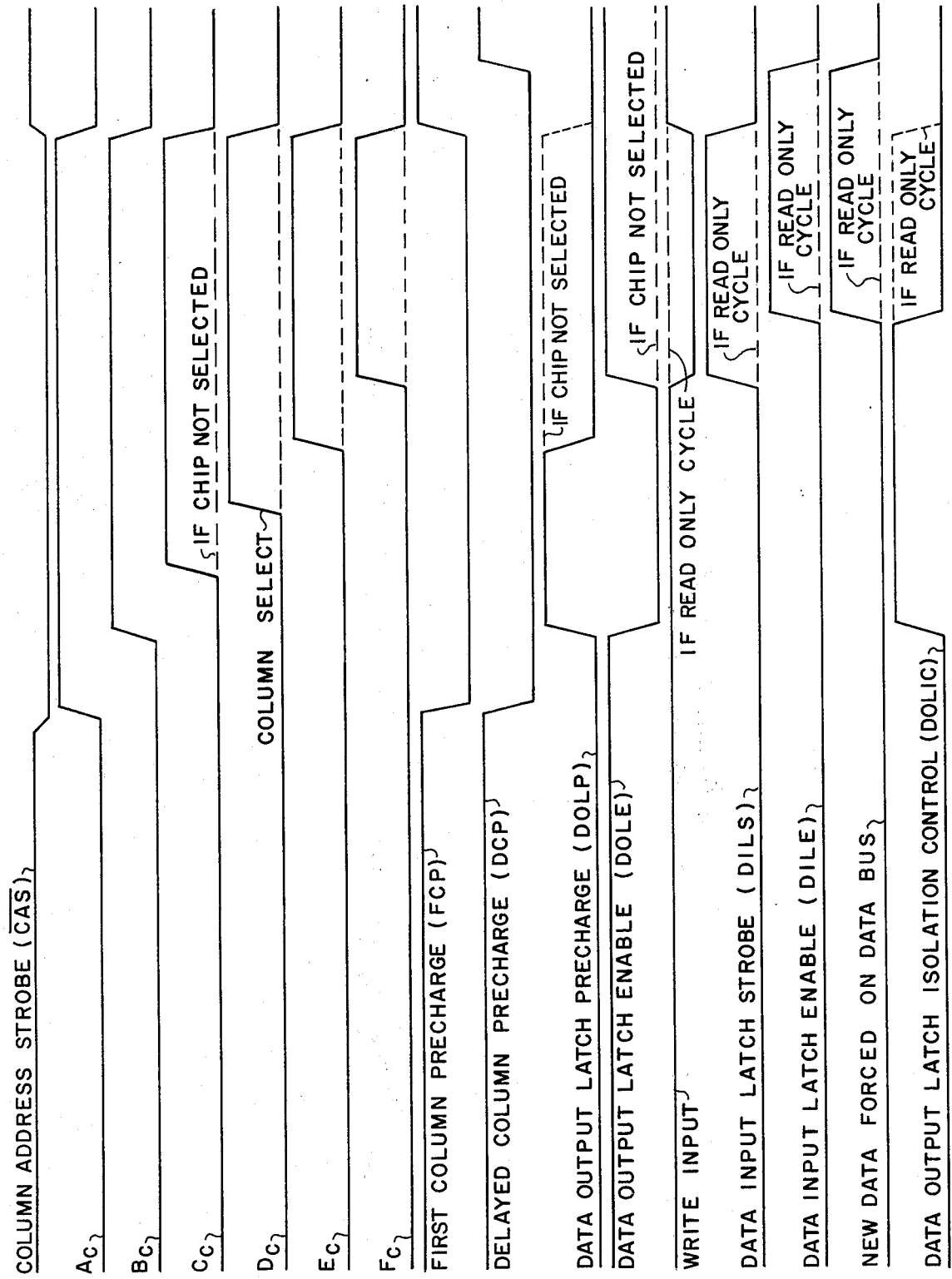
FIG. 6 is a timing diagram which serves to illustrate the operation of the column clock and control circuit of FIG. 5.

Refer now to FIGS. 5 and 6. Prior to the column address strobe $\overline{CAS}$ going low, the first column precharge (FCP) and delay column precharge (DCP) signals are high. As a result, nodes 160 and 164 of the column address latches (see FIG. 9) are charged to $V_{gg}$ less one threshold as a result of transistors 162 and 166 being turned on, and nodes 202 and 203 (see FIG. 10) of the column decoders are charged to $V_{gg}$ less one threshold as a result of transistors 204 being turned on. Similarly, nodes 374 and 346 (see FIG. 5) are charged to $V_{gg}$ less one threshold. Transistors 370 and 350 are thus turned on by the potential on nodes 374 and 347, respectively, so that nodes 372 and 342 are at ground since $B_C$ is at ground at this time. Also, delay column precharge turns transistor 390 on so that the data bus 332 is charged to $V_{gg}$ less one threshold, and nodes 160 and 164 of the data input latch 26 are also charged to $V_{gg}$ less one threshold. Both the true and complement outputs of the six column address latches 16, and all sixty-four column select lines from the sixty-four column decoders 20 are at ground. The output of NOR gate 30 and delay 324 are also at ground so that the true and complement outputs 326 and 328 from the data input latch 26 are at ground, and transistors 327, 328, 329 and 330 are also all turned off to isolate the data bus 332 so that it can be precharged to $V_{gg}$ less one threshold and transistors 376 and 378 are off. Since node 372 is at ground during the precharge period, transistor 340 is turned off to isolate the input to the data output latch 28. Node 342 is low which holds transistor 364 off so that node 360 remains high from the last $\overline{CAS}$ cycle when clock output $F_C$ was high even though transistor 362 is now also off. Since node 360 remains high, data in the data output latch 28 remains valid, provided the chip was addressed during the previous $\overline{CAS}$ cycle as will hereafter be described in greater detail.

When the column address strobe $\overline{CAS}$ goes low, the output $A_C$ of inverter 300 immediately goes high. This causes the output of inverter 308, which is the first column precharge FCP, to immediately go low, and also causes the output of delay 309, which is the delayed column precharge DCP, to immediately go low. When the first column precharge FCP and delayed column precharge DCP go low, transistors 373 and 344 (see FIG. 5) are turned off, isolating precharge voltages on nodes 374 and 346, respectively. Additionally, transistor 390 turns off, isolating the precharge voltage on the data bus 332. The precharge transistors on the column address latches 16, the column decoder 20, and data input latch 26 are all turned off. Also, the precharge transistors on the delay stages 301, and 303 – 306 are turned off. Clock edge $A_C$ is also the strobe for the column address latches 16, and clock edge $B_C$ is the enable for the column address latches 16 which latches the data on the six address lines into the six bits of the column address latches. Clock pulses $B_C$ is also transferred through transistor 370 to node 372 to turn transistor 340 on, thus connecting node 160 of the data output latch 28 (see FIG. 11) to the data bus 332, and is transferred through transistor 350 to cause node 342 to go to $V_{gg}$, thus applying a precharge signal DOLP to data output latch 28. Node 342 also turns transistor 364 on, thus discharging node 360 to ground, bringing the data output latch enable signal DOLE to ground which causes both the true and complement outputs 382 and 384 to go to ground, thus turning transistors 386 and 388 off and causing the data output to go to an open circuit condition.

Clock outputs $A_C$ and $B_C$ are also applied to the chip select latch 32 so that the chip select signal will be latched up on the occurrence of clock pulse $B_C$. The complement output of the chip select latch is applied directly as the input to the next delay stage, 303. If the chip has been selected and if the row address signal $\overline{RAS}$ is low, then the chip select latch produces an output to delay stage 303 so that clock edges $C_C$ through $F_C$ follow as indicated in solid outline in FIG. 6. If a chip has not been selected, or if the row address strobe $\overline{RAS}$ is not low, then clock pulses $C_C - F_C$ do not occur as represented by the dotted lines in FIG. 6. In the latter event, the column decoder 20 is not enabled by output $D_C$ and no column select signal $C_S$ is applied to the addressed column.

It will also be noted that upon the occurrence of clock pulse $B_C$, the data output latch precharge node DOLP goes high which sets the data output latch 28 to the precharge state causing the true and complement outputs both to go to ground, turning off transistors 386 and 388. Thus if the chip is not selected or $\overline{RAS}$ has not occurred, the data output latch enable signal DOLE on node 360 remains low because clock pulse $F_C$ does not occur, both the true and complement outputs 382 and 384 remain low, and the data output remains in the open circuit state so that in a memory system, the data output bus that is common to many chips will have valid data from the single chip that was selected.

Figure 14:
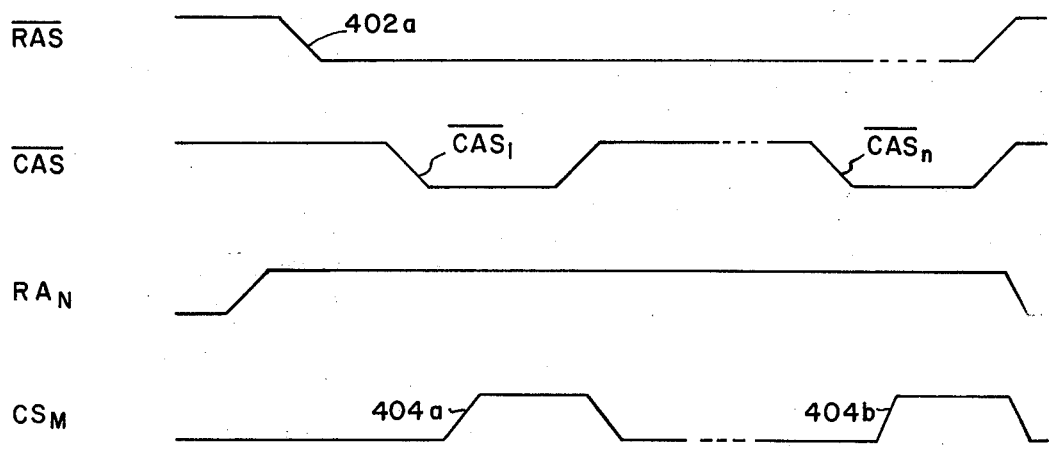
FIG. 14 is a schematic timing diagram which serves to illustrate the "Page" mode of operation of the circuit of FIG. 1.

Assume now that the chip is selected and that a read-modify-write cycle is to be performed, i.e., data is to be read from a particular storage cell and then new data rewritten in the same storage cell. Such a cycle is represented in FIG. 14. The cycle is started when row address strobe $\overline{RAS}$ goes low. The state of the six address lines at the $\overline{RAS}$ negative edge are then latched in the row address latches and the data from the sixty-four storage cells of the addressed line are transferred to the register formed by the sixty-four sense amps as represented by the state of the sixty-four transistors $Q_8$.

Any time after the occurrence of row clock edge $D_R$, the address inputs are externally changed from valid row addresses to valid column addresses and any time thereafter the column address strobe $\overline{CAS}$ goes low to cause the new address data designating the column to be transferred to the column address latches. This results in all of the events which were previously described as occurring after clock edges $A_C$ and $B_C$. Also, since the chip is selected, the complement output from the chip select latch goes high so that clock edges $C_C - F_C$ from delay stages 303 – 306 occur. As a result, clock edge $D_C$ enables the column decoder 20 which produces a column select on one of the sixty-four column select lines. This turns transistors $Q_{10}$ and $Q_{11}$ of the selected sense amp and write circuit $SA_1 - SA_{64}$ on. If the sense amp contains a logic "0", i.e., transistor $Q_8$ is on and the column bus $CB_1$ is low, then the data bus 332 is also discharged to ground through transistors $Q_8$ and $Q_{10}$. It will be noted that during this period, the data output latch isolation control DOLIC from node 372 is high so that transistor 340 is turned on, discharging node 160 of the output latch 28. Then on the occurrence of clock pulse $F_C$, transistor 362 is turned on which causes the data output latch enable node DOLE to go high, and since node 160 is discharged, the complement output follows DOLE high. Conversely, if transistor $Q_8$ of the addressed sense amp and write circuit is turned off, indicating that a logic "1" was stored in the addressed cell, the data bus 332 remains at a high level and a logic "1" is latched into the data output latch 28 as the true output follows DOLE high while transistor 174 discharges node 164. The outputs 382 and 384 of the data output latch then turn either transistor 388 or transistor 386 on to produce either a logic "1" or a logic "0" at the data output from the chip.

Figure 13:
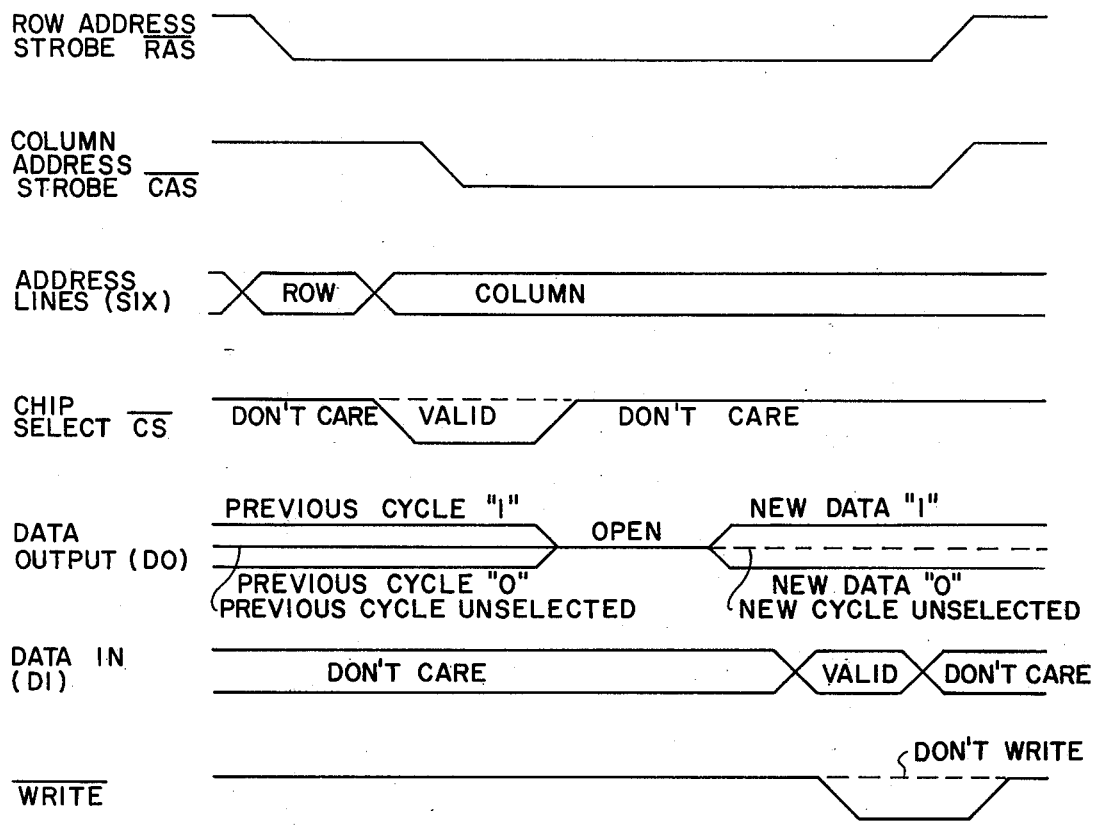
FIG. 13 is a timing diagram which illustrates a typical read-modify-write cycle of the circuit of FIG. 1.

The new data to be written into the cell is applied to the data input terminal 320 of the data input latch 26 at any time prior to the write signal $\overline{WRITE}$ going low as indicated in FIG. 13. The data input latch is identical to the other input latches already described. The combination of the column address strobe $\overline{CAS}$ and the $\overline{WRITE}$ being low causes the output of NOR gate 30 to go high. The output of gate 30 functions as the data input latch strobe DILS (see FIG. 6) to data input latch 26 and also triggers delay 324, which a short time later produces the data input latch enable signal DILE (see FIG. 6) to the data input latch, thus completing the latching of the new input data into the data input latch. As the data input latch 26 is enabled, the outputs 326 and 328 cause the true data buffer comprised of transistors 327 and 328 to drive the data bus 332 either to a logic "0" or a logic "1". It will be recalled that transistor $Q_{10}$ (see FIG. 2) of the selected column is turned on by the column select (CS) signal so that the selected column bus $CB_1$ in the example is forced either to $V_{gg}$ less one threshold or to ground, depending on the data latched in the input data latch. Simultaneously with forcing the new data on the data bus, the output from delay 324 also provides the write command WC to the sense amp and write circuits (see FIG. 2), which is transferred through transistor $Q_{11}$, which is turned on in the selected column only by the column select signal CS and turns transistors $Q_{12}$ and $Q_{13}$ on. Transistor $Q_{13}$ discharges node 56 to ground to ensure that transistor $Q_7$ is turned off. Transistor $Q_{12}$ transfers the complement data input signal $\overline{DI}$ generated by the complement buffer comprised of transistors 329 and 330 to node 74 which is the gate of transistor $Q_8$. Thus, if a logic "1" is to be stored in the cell, the data bus 332 and column bus $CB_1$ would be driven to a logic "1" or $V_{gg}$ less one threshold level. This would be made possible by the logic "0" or ground level on the complement data input $\overline{DI}$ bus 82 which would turn transistor $Q_8$ off. Since one row is selected, this level is also transferred into the selected storage cell. Conversely, if a logic "0" is to be stored, the complement data input $\overline{DI}$ would turn transistor $Q_8$ on to help the data bus 332 drive the column bus $CB_1$ to ground and to update the status of transistor $Q_8$ to reflect the desired status of the column bus. The latter function is also necessary when operating in the "Page Mode" as will presently be described. It should be noted that the output from delay 324 causes the data output latch isolation control terminal 372 to go to ground as a result of turning transistors 376 and 378 on, thus turning transistor 340 off and isolating the data output latch from the data bus so that the data just read from the addressed cell will remain valid even though the write operation changes the data bus. It should also be noted that transistor $Q_{14}$ is turned on by the delayed column precharge DCP to ensure that the gate nodes of transistors $Q_{12}$ and $Q_{13}$ are discharged and that the transistors are off at the start of a cycle.

At the conclusion of the row address strobe $\overline{RAS}$ and column address strobe $\overline{CAS}$, all of the clock $A_R - J_R$ and $A_C - F_C$ return to the low state. This terminates both the signal on the row address line $RA_1$ to freeze the data in storage cell, and also terminates the column select CS output from the column decoder. One delay cycle later the delayed row precharge DRP and the delayed column precharge DCP both go to the high state. The reason for the delayed precharge signal is to assure that the column bus $CB_1$ is at the appropriate voltage until after the transistor for the cell is turned off by the row address line $RA_1$ in the example, returning to ground, so that good logic level will remain in the cells.

Thus, as a result of the read-modify-write cycle, data has been transferred from all storage cells in the addressed row to the corresponding sense amp and write circuits where the corresponding transistors $Q_8$ have been switched on or off to appropriately store the data read from the respective cells on the respective column buses. The information stored on the addressed column bus is then transferred to the data output latch only if the chip is selected. The data output terminal of all unselected chips unconditionally assume an open circuit state when $\overline{CAS}$ strobe occurs. Data was then strobed into the data input latch 26 of the input latches of all chips by the $\overline{WRITE}$ signal. The new data was then transferred to the addressed column bus and thereby to the addressed cell, and the transistor $Q_8$ of the addressed column appropriately updated only for the selected chips. Input data is strobed into the input latches of all chips, but is transferred to the addressed column bus of only the selected chips. During the write mode, the data output latch 28 was isolated so that it continues to contain valid data read from the cell during the read part of the read-modify-write cycle. This output data remains valid until clock edge $B_C$ following the next column address strobe $\overline{CAS}$.

An important feature of the present invention is illustrated in FIG. 14 where it is noted that successive column address strobes $\overline{CAS}_1 - \overline{CAS}_n$ can be produced during a single row address strobe $\overline{RAS}$ to strobe different column addresses 404a and 404b into the column address latch 16. During each separate column address strobe $\overline{CAS}_1 - \overline{CAS}_n$, either a read, a read-modify-write, or simply a write cycle can be accomplished without the delay of the portion of the row address cycle which must precede the first column address cycle but not additional column address cycles that share the same row address. This is possible since all data input and output circuitry is controlled by the column address strobe.

If there is no need to read data from the addressed cell, the read portion of the cycle can be eliminated by applying the $\overline{WRITE}$ signal before DOLE goes high at clock edge $F_C$. Either the column address strobe $\overline{CAS}$, or the $\overline{WRITE}$ signal may be used to control the output from NOR gate 30 and initiate the write cycle. If the $\overline{WRITE}$ signal is low before $\overline{CAS}$ goes low, $\overline{CAS}$ going low will cause NOR gate 30 to go high and thus initiate the transfer of the new data into the data input latch 26. The output DILE from delay 324 then turns transistors 376 and 378 (see FIG. 5) on at approximately the same time as clock edge $B_C$, so that the data output isolation control goes low and turns isolation transistor 340 off. Since tranistor 340 being off prevents the discharge of node 160 of the data output latch 28 (see FIG. 11), transistors 151 and 152 remain on and transistors 150 and 153 are switched off by transistor 174 so that a logic "1" output from the data output latch when clock edge $F_C$ provides the data output latch enable signal on node 360 after clock pulse $E_C$. As a result, the data output pin unconditionally goes to a logic "1" level indicating that the write cycle only was performed.

Although a preferred embodiment of the invention has been described in detail, it will be understood that various changes, substitutions and alterations can be made therein without departing from the spirit and scope of the invention as defined by the appended claims.

What is claimed is:

1. The random access memory which comprises a monolithic semiconductor chip having formed thereon:
   a matrix of memory cells each including a data storage capacitor, the cells being arrayed in rows and columns, the storage capacitor of each cell in each column being connected to a corresponding column bus in response to a voltage on a row address line and the data being transferred to and from each cell in each column by the corresponding column bus;

a sense amp for each column bus for discriminating between at least two voltage levels representative of logic states and storing the detected logic state;

a plurality of address inputs;

row address latch means for storing address data applied to the address inputs;

row decoder means for enabling a row address line designated by the address data in the row address latch means;

a row address strobe signal input;

row address clock and control means responsive to a signal on the row address strobe input for automatically causing the data on the address inputs to be latched in the row address latch means, for causing a row address line to enable the storage cells in the row, and for causing the data in the storage cells to be transferred by the respective column buses to the respective sense amp and stored, and for rewritting data from the respective column buses into the respective cells;

a column address strobe signal input;

column address latch means for storing address data applied to said address inputs;

a data bus;

column decoder means for enabling an addressed sense amp to transfer data between the data bus and the enabled sense amp;

a data input;

a data input latch for storing data applied to the data input;

a data output;

a data output latch for storing at least two logic levels and applying corresponding logic signals to the data output;

a chip select signal input;

a write signal input; and column clock and control means responsive to a signal on the column address strobe for latching data applied to the address line in the column address latch means, and in the presence of a predetermined signal on the chip select input for enabling an addressed sense amp to transfer data from the sense amp through the data bus to the data output latch, and in the presence of a predetermined signal on the chip select input and on the write input for latching data applied to the data input in the data input latch and transferring data from the data input latch to the enabled sense amp while isolating the data output latch from the data bus.

2. The random access memory of claim 1 wherein each sense amp comprises:

a differential amplifier having reference and data input nodes, the amplifier being adapted to output one logic signal when the inputs are near the same voltage and another logic level when the inputs are at different voltage levels, and means responsive to the row clock and control means for precharging the respective column bus to a reference voltage level and trapping the reference voltage on the reference input node, and then outputting a logic level dependent upon the voltage level of the respective column bus after the respective addressed memory cell is enabled.

3. The random access memory which comprises a monolithic semiconductor chip having formed thereon:

a matrix of storage cells arrayed in rows and columns, the storage cell in each column being connected to a corresponding column bus in response to a voltage on a row address line and the data being transferred to and from each cell in each column by the corresponding column bus;

a sense amp for each column bus for detecting the logic state of an enabled cell connected to the respective column bus as the cell is enabled and holding the detected logic state;

row address means for enabling a row of storage cells designated by row address data;

a row address strobe input for inputting a row address strobe signal to the chip;

row address clock and control means responsive to a row address strobe signal on the row address strobe input for automatically causing an addressed row of storage cells to be enabled and the data in the storage cells of the row to be detected by the respective sense amp and held;

a data bus;

column address means responsive to a column address strobe signal input to the chip after the row address strobe signal for enabling an addressed sense amp to transfer data between the data bus and the enabled sense amp; and data transfer means for transferring data between the data bus and circuitry external to the chip.

4. In a random access memory which comprises a monolithic semiconductor chip having a matrix of storage cells arrayed in rows and columns, the method of addressing a storage cell which comprises applying a first set of binary address signals to a number of address inputs to the chip and then applying a second set of address signals to the same address inputs to specifically identify a selected column of the array and thus identify a selected cell.

5. The method of addressing a desired memory cell of a memory formed on a monolithic semiconductor chip having a matrix of storage cells arrayed in rows and columns which comprises sequentially applying first and second sets of binary address signals to the same address inputs to the chip to identify the row and column of the desired memory cell.

6. In a random access memory formed on a monolithic semiconductor chip and having a series of precharge periods each followed by a data access period initiated by a strobe signal, the method for outputting data from the chip which comprises reading data from a selected memory cell during an access period and storing the data read from the cell in a data output latch during the remainder of the access period and at least a portion of the succeeding precharge period, and outputting the data from the data output latch to circuitry external of the chip during at least a portion of said succeeding precharge period.

7. The circuit for producing a clock signal above a drain supply voltage between first and second successive clock edges and substantially at a source supply voltage after the second clock edge until a precharge signal which occurs some period after the second clock edge and terminates before the next first clock edge which comprises:

a precharge node, an output node, a capacitor coupling the precharge node and the output node, a first transistor connecting the precharge node to the drain supply voltage, a second transistor connecting the precharge node to the source supply voltage, a third transistor connecting the output node to the drain supply voltage, and a fourth transistor connecting the output node to the source supply voltage, the second and third transistors being turned on by the precharge signal, the first transistor being turned on by the first clock edge and the fourth transistor being turned off by the second clock edge.

8. In a random access memory formed on a monolithic semiconductor chip and having a plurality of memory cells each having a storage capacitor connected to a column bus when a transistor is turned on by an enabling signal, the method of detecting the logic level stored on the capacitor of an enabled cell which comprises:

precharging the column bus to precharge voltage level, sampling the precharge voltage level on the column bus and storing the sampled voltage on a reference node, then enabling a selected storage cell by turning the transistor of the selected cell on, detecting a predetermined change in the column bus from the sampled voltage stored on the reference voltage, and changing the voltage level on the column bus in the event a predetermined change in the voltage level is detected, to a voltage level corresponding to the voltage level of the capacitor of the enable cell before the cell was enabled.

9. In a random access memory, the method of claim 8 wherein:

the column bus is precharged to a voltage near a drain supply voltage, and the column bus is discharged to a voltage level near a source supply voltage in the event a predetermined charge in the voltage of the column bus is detected by turning a transistor on to connect the column bus to a source supply voltage.

10. In a random access memory, the sense amp for detecting voltage levels on a column bus connected to a memory cell by row enabling signal comprising:

a differential amplifier having reference and data input nodes connectable to the column bus, the amplifier being adapted to output, when enabled, one logic state when the input nodes are near the same voltage level and another logic state when the inputs are at different voltage levels, and circuit means for precharging the column bus and the reference node to a precharge level, then isolating the precharge node from the column bus and connecting a memory cell to the column bus to change the voltage level of the column bus if said other logic state is stored in the memory cell without changing the voltage level on the reference node, and then enabling the output of the amplifier.

11. In a random access memory formed on a monolithic chip and having a plurality of memory cells arrayed in rows and columns, the method of accessing data which comprises:

applying a row strobe to the chip to automatically transfer data from all memory cells in an addressed row to a column register, and applying a column strobe to the chip to automatically transfer data between an addressed bit of the column register and circuitry external to the chip, the row address data and column address data being substantially input to the chip through the same address inputs to the chip.

12. In a random access memory which comprises a monolithic semiconductor chip, the combination of:

a matrix of storage cells arrayed in rows and columns, the storage cell in each column being connected to a corresponding column bus in response to a voltage on a row address line and data being transferred to and from each cell in each column by the corresponding column bus;

sense amp means for each column bus for discriminating between at least two voltage levels representative of logic states and holding the detected logic state;

a plurality of binary row address inputs to the chip sufficient in number to binarily define the number of rows or columns, whichever is greater;

a row address strobe input for inputting a row address strobe to the chip;

row address decode means responsive to a row address strobe input to the chip for decoding row address data and holding the addressed row of memory cells enabled until termination of the row address cycle;

a column address strobe input for inputting a column address strobe signal to the chip;

column address latch means for storing column address data applied to said address inputs; and column address decoder means responsive to a column address strobe signal for enabling the transfer of data from the sense amp means for the column identified by the column address.

13. In a random access memory which comprises a monolithic semiconductor chip, the combination of:

a matrix of storage cells arrayed in rows and columns;

a plurality of address inputs limited in number to that required to define the greater of the number of rows or columns for inputting a corresponding number of address signals to the chip;

strobe input means for inputting time spaced row address strobe and column address strobe signal to the chip;

row address means responsive to a row address strobe input through the strobe input means for holding a row of storage cells defined by the address signals then on the address inputs enabled for processing of data therein; and column address means responsive to a column address strobe input through the strobe input means for holding the storage cells defined by the address signals then on the address inputs enabled for processing of data therein.

14. The combination of claim 13 further characterized by means for automatically in response to a row address strobe and independent of the column address strobe refreshing data stored in all memory cells in the row defined by the address signals then on the address inputs.

15. The method of addressing a selected memory cell of a matrix of memory cells arrayed in rows and columns on a monolithic semiconductor chip disposed in a multiple pin package which comprises:

applying one binary input of a set of binary inputs which identify the row of selected memory cell to each of a set of address pins of the package;

applying one address strobe signal to a pin of the package to cause the row address information on the set of address pins to be input and stored in the circuit; then applying each binary input of a set of binary inputs which identify the column of the selected memory to one of the same set of address pins of the package; and applying another address strobe signal to a pin of the package to cause to column address information on the set of address pins to be input to the circuit.

16. In a memory formed on a monolithic semiconductor chip of a field effect transistor and having a plurality of logic inputs to which logic input signals are normally applied in sequence in the operation of the memory, the input circuit comprising an inverter stage including:

an output node for the inverter stage;

a load impedance circuit including an impedance device and a first transistor connecting the output node to a drain voltage supply node so as to block any current through the impedance circuit when turned off; and an input circuit including at least a second transistor connecting the output node to a source supply voltage node, the gate of the second transistor being a logic input to the chip;

the first transistor being turned on in response to a logic input signal normally applied to another logic input to the chip before a logic signal would normally be applied to the gate of the second transistor whereby the inverter stage will be turned off and not dissipate energy in the absence of the earlier logic signal.

17. In a random access memory formed on a monolithic semiconductor chip having a matrix of memory cells and logic means for addressing a selected memory cell of the matrix, the combination of strobe input means for inputting an externally generated strobe signal to the chip;

first means for applying externally generated alternative logic levels to the chip for indicating that the chip is selected or not selected;

second means for applying externally generated alternative logic levels to the chip for indicating a read cycle or a write cycle; and logic means responsive to an externally generated strobe signal applied to the strobe input means including data output latch means for:

a. in the presense of a chip not selected logic level on the first means causing the data output to be an open circuit until responding to another strobe input signal, b. in the presence of a chip selected logic level on the first means and a read cycle logic level on the second means producing a logic output representative of the logic level stored in an addressed memory cell until responding to another strobe input signal, and c. in the presence of a chip selected logic level and a write logic level automatically storing data in an addressed memory cell and a predetermined state at the data output until responding to another strobe input signal.

18. In a random address memory formed on a monolithic chip and having a matrix of memory cells arrayed in rows and columns, a set of address inputs sufficient in number to logically define only the number of rows or columns, whichever is greater, strobe input means for sequentially inputting a row strobe signal and a column strobe signal to the chip, data means for inputting and outputting binary data from the chip, and read/write control input means for inputting a signal to the chip having a read logic strobe for a read common and write logic strobe for a write command, the method comprising:

applying a set row address signals representing a row of memory cells in the matrix to the address inputs to the chip;

gating the row address signals into the chip in response to a row strobe signal and then holding the row of memory cells identified by the row address signals enabled;

applying a set of column address signals representing a column of memory cells in the matrix to the same address inputs to the chip; and gating the column address signals into the chip in response to a column strobe signal to enable the processing of data in the memory cell of the addressed row and the addressed column.

19. The method of claim 18 further comprising:

applying a succession of sets of column address signals to the address inputs and a succession of column strobe signals to the strobe input means while holding the same row of memory cells enabled to sequentially enable the processing of data in a series of enabled memory cells in the addressed row.

20. The method of claim 18 wherein the write logic state is applied to the read/write control input means before said predetermined minimum time after the column strobe signal of automatically causing the data output from the chip to go to an open circuit and to automatically cause data at a data input to the chip to be stored in the addressed memory cell.

21. The method of claim 18 further comprising:

applying said read logic state to the read/write control input means for a predetermined minimum time before and after the column strobe signal for automatically causing data in the addressed memory cell to be stored in a data output latch and be output from the chip until after the next input on the strobe input means.

22. The method of claim 21 further comprising changing the logic state applied to the read/write control input means from the read logic state to the write logic state after the predetermined minimum time after the column strobe signal for automatically causing data to be input and stored in the addressed memory cell while the data read from the addressed memory cell continues to be stored in the data output latch.

23. In a random address memory formed on a monolithic chip and having a plurality of memory cells arrayed in rows and columns, the method of accessing data which comprises:

applying a row strobe signal to the chip to automatically transfer data from all memory cells in an addressed row to a column register, and applying a column strobe signal to the chip to then automatically transfer data between an addressed bit of the column register and circuitry external to the chip.

24. The method of claim 23 wherein a write signal is gated into the chip by the column strobe signal to cause the automatic transfer of data at a data input to the addressed memory cell.

25. The method of claim 24 wherein the data output is caused to go to a predetermined logic state in the event a write signal is applied to the chip before or within a predetermined time period after a column strobe signal is applied to the chip.

26. The method of claim 23 wherein the absence of a write signal applied to the chip at the time of the column strobe signal results in data from an addressed bit of the column register being automatically output from the chip in response to a column strobe signal.

27. The method of claim 26 wherein a write signal applied to the chip a predetermined period of time after a column strobe signal is applied to the chip automatically transfers data at a data input to an addressed memory cell after data is output from the addressed bit of the column register.

28. The method of claim 26 wherein the transfer of data to or from the chip enabled by a chip select signal is disabled by the absence of a chip select signal applied to the chip.

29. The method of claim 28 further characterized by causing:
the data output to go to an open circuit condition in the absence of a chip select signal.

30. The method of claim 23 wherein a plurality of sets of addresses and column strobes are sequentially applied to the chip after a single row strobe to automatically sequentially transfer data between a plurality of bits of the column register and circuitry external to the chip.

* * * * *

UNITED STATES PATENT AND TRADEMARK OFFICE
CERTIFICATE OF CORRECTION

PATENT NO. : 3,969,706
DATED : July 13, 1976
INVENTOR(S) : Robert James Proebsting; Robert Sherman Green It is certified that error appears in the above-identified patent and that said Letters Patent are hereby corrected as shown below:

Col. 8, line 5, "BR" should be -- $B_R$ --.

Col. 10, line 22, "343" should be -- 342 --.

Col. 19, line 39, "line" should be -- lines --.

Col. 21, Claim 10, line 45, after "by", should be -- a --.

Col. 22, Claim 13, line 44, "signal" should be -- signals --.

Signed and Sealed this

Twenty-eighth Day of December 1976

[SEAL]

Attest:

RUTH C. MASON
*Attesting Officer*

C. MARSHALL DANN
*Commissioner of Patents and Trademarks*